US012670956B2

(12) United States Patent
    Conti et al.

(10) Patent No.:    US 12,670,956 B2
(45) Date of Patent:        Jun. 30, 2026

(54) SELF-SUPPORTING SGD STADIUM

(71) Applicant: Micron Technology, Inc., Boise, ID (US)

(72) Inventors: Anna Maria Conti, Milan (IT); Umberto Maria Meotto, Dietlikon (CH); Domenico Tuzi, Balsorano (IT)

(73) Assignee: Micron Technology, Inc., Boise, ID (US)

( * ) Notice: Subject to any disclaimer, the term of this patent is extended or adjusted under 35 U.S.C. 154(b) by 761 days.

(21) Appl. No.: 17/898,827

(22) Filed: Aug. 30, 2022

(65) Prior Publication Data

US 2024/0071497 A1      Feb. 29, 2024

(51) Int. Cl.
| | |
|---|---|
| *H01L 33/48* | (2010.01) |
| *G11C 16/04* | (2006.01) |
| *H01L 25/075* | (2006.01) |
| *H01L 33/20* | (2010.01) |
| *H01L 33/62* | (2010.01) |
| *H10B 41/27* | (2023.01) |
| *H10B 41/35* | (2023.01) |
| *H10B 43/27* | (2023.01) |
| *H10B 43/35* | (2023.01) |

(52) U.S. Cl.
CPC ......... *G11C 16/0483* (2013.01); *H10B 41/27* (2023.02); *H10B 41/35* (2023.02); *H10B 43/27* (2023.02); *H10B 43/35* (2023.02)

(58) Field of Classification Search
CPC ................................. H10B 43/35; H10B 41/35
See application file for complete search history.

(56) References Cited

U.S. PATENT DOCUMENTS

| | | | | |
|---|---|---|---|---|
| 2018/0294277 A1* | 10/2018 | Kim | ......................... | G11C 8/08 |
| 2019/0304993 A1* | 10/2019 | Lee | ........................ | H10B 43/27 |
| 2021/0143169 A1 | 5/2021 | Lee | | |

* cited by examiner

*Primary Examiner* — John A Bodnar

(74) *Attorney, Agent, or Firm* — Schwegman Lundberg & Woessner, P.A.

(57) ABSTRACT

A variety of applications can include apparatus having memory devices, where at least one of the memory devices is a three-dimensional memory device having levels of pillars to support pillars of memory cells and one or more drain-end select gate (SGD) transistors of the memory array of the memory device. The levels of pillars are structured as a progression of pillars, where each pillar of one level is structured on and extending vertically from a different pillar of a level on which the one level is located. SGD select lines for coupling to the one or more SGD transistors are structured in a SGD stadium, where the SGD stadium is located within at least a portion of the progression of pillars.

20 Claims, 31 Drawing Sheets

1700 —

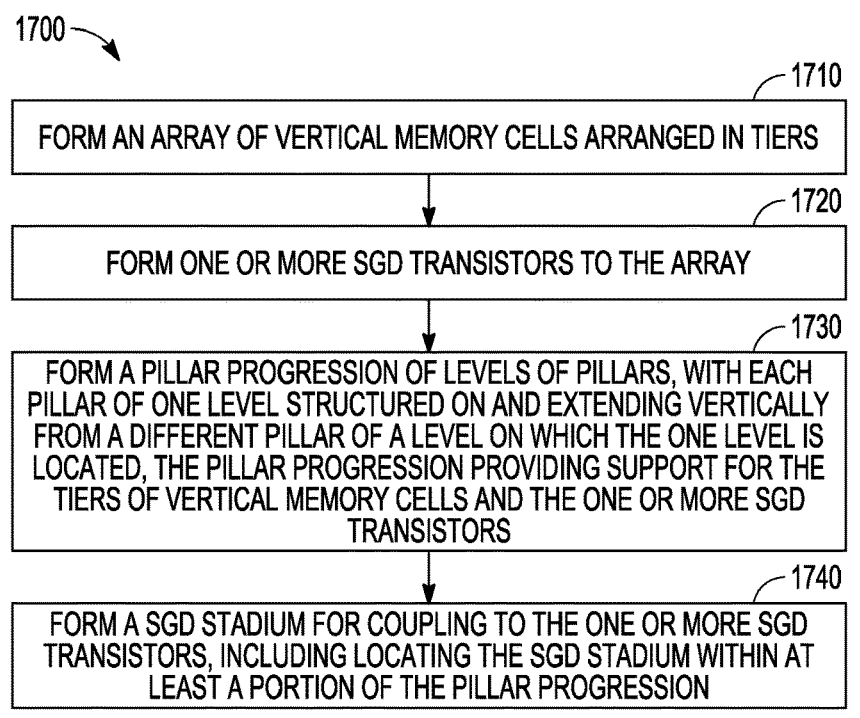

1710

FORM AN ARRAY OF VERTICAL MEMORY CELLS ARRANGED IN TIERS

1720

FORM ONE OR MORE SGD TRANSISTORS TO THE ARRAY

1730

FORM A PILLAR PROGRESSION OF LEVELS OF PILLARS, WITH EACH PILLAR OF ONE LEVEL STRUCTURED ON AND EXTENDING VERTICALLY FROM A DIFFERENT PILLAR OF A LEVEL ON WHICH THE ONE LEVEL IS LOCATED, THE PILLAR PROGRESSION PROVIDING SUPPORT FOR THE TIERS OF VERTICAL MEMORY CELLS AND THE ONE OR MORE SGD TRANSISTORS

1740

FORM A SGD STADIUM FOR COUPLING TO THE ONE OR MORE SGD TRANSISTORS, INCLUDING LOCATING THE SGD STADIUM WITHIN AT LEAST A PORTION OF THE PILLAR PROGRESSION

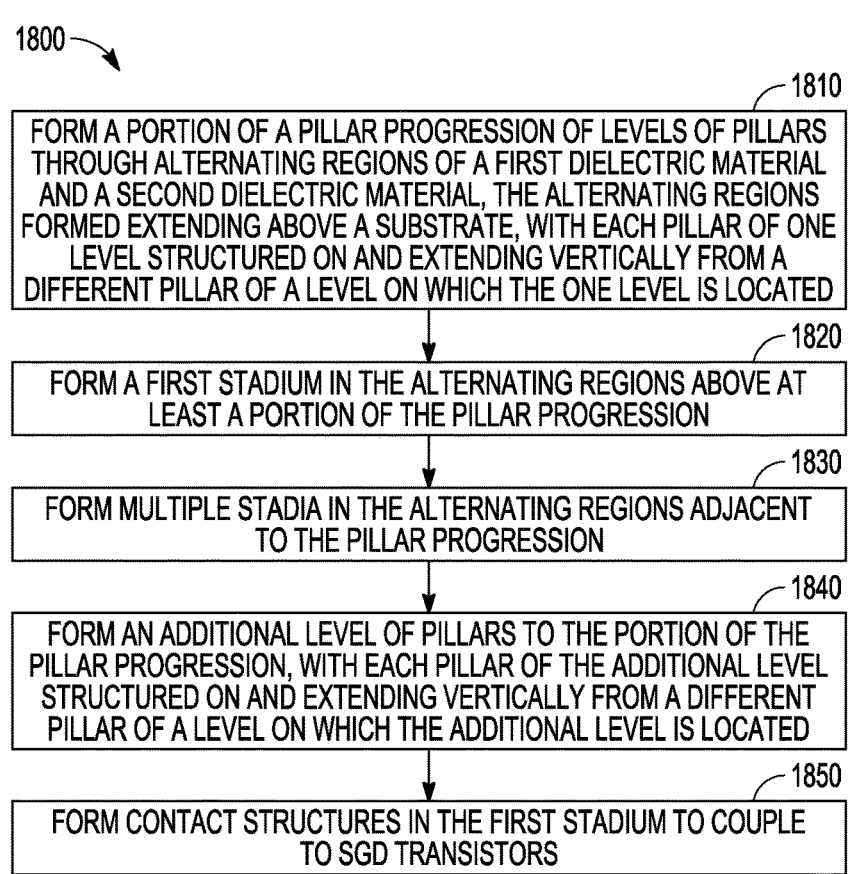

1810

FORM A PORTION OF A PILLAR PROGRESSION OF LEVELS OF PILLARS THROUGH ALTERNATING REGIONS OF A FIRST DIELECTRIC MATERIAL AND A SECOND DIELECTRIC MATERIAL, THE ALTERNATING REGIONS FORMED EXTENDING ABOVE A SUBSTRATE, WITH EACH PILLAR OF ONE LEVEL STRUCTURED ON AND EXTENDING VERTICALLY FROM A DIFFERENT PILLAR OF A LEVEL ON WHICH THE ONE LEVEL IS LOCATED

1820

FORM A FIRST STADIUM IN THE ALTERNATING REGIONS ABOVE AT LEAST A PORTION OF THE PILLAR PROGRESSION

1830

FORM MULTIPLE STADIA IN THE ALTERNATING REGIONS ADJACENT TO THE PILLAR PROGRESSION

1840

FORM AN ADDITIONAL LEVEL OF PILLARS TO THE PORTION OF THE PILLAR PROGRESSION, WITH EACH PILLAR OF THE ADDITIONAL LEVEL STRUCTURED ON AND EXTENDING VERTICALLY FROM A DIFFERENT PILLAR OF A LEVEL ON WHICH THE ADDITIONAL LEVEL IS LOCATED

1850

FORM CONTACT STRUCTURES IN THE FIRST STADIUM TO COUPLE TO SGD TRANSISTORS

FIG. 18

SELF-SUPPORTING SGD STADIUM

FIELD OF THE DISCLOSURE

Embodiments of the disclosure relate generally to electronic devices and systems and, more specifically, to memory devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line. Enhancements to the structure or design associated with the array of memory cells in memory devices or other devices can provide for increased stability and increased ability to form signal routes between the memory array structure and control circuitry.

BRIEF DESCRIPTION OF THE DRAWINGS

The drawings, which are not necessarily drawn to scale, illustrate generally, by way of example, but not by way of limitation, various embodiments discussed in the present document.

FIG. 17 is a flow diagram of features of an example method of forming portions of a memory device, according to various embodiments.

FIG. 18 is a flow diagram of features of another example method of forming portions of a memory device, in accordance with various embodiments.

DETAILED DESCRIPTION

Figure 1:
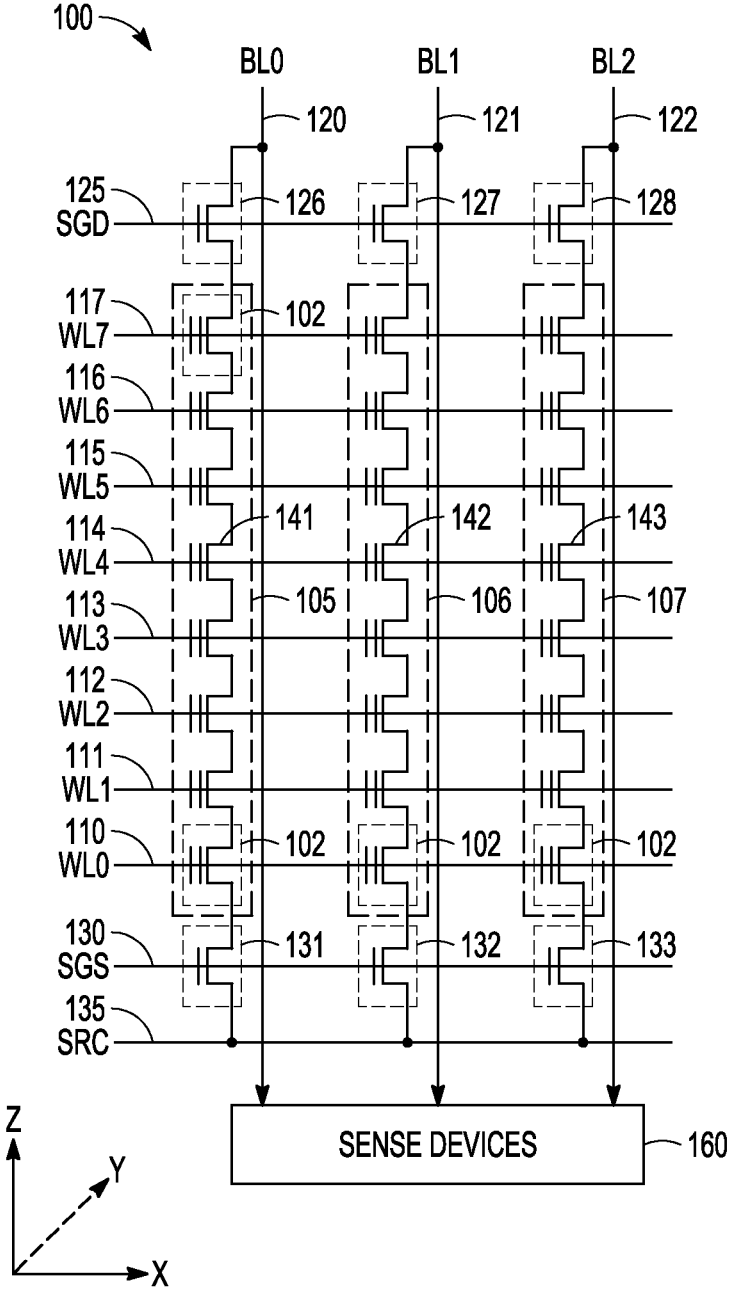
FIG. 1 illustrates an example schematic diagram of a portion of semiconductor memory array of an architecture of a memory device, in accordance with various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction substantially perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

A 3D memory array of a memory die can extend in a horizontal plane along a substrate, which can be designated as a x-y plane, and in a vertical direction, taken as the z direction perpendicular to the x-y plane. Design considerations can be implemented with the 3D memory array such as using a circuit-under-array (CuA) architecture to enhance ability to reduce die size or increase utilization of space in a die. CuA refers generally to circuitry located in a memory die at a level under a memory array of the memory die. A CuA region can include control logic and sensing circuitry for sensing the programmed data states of memory cells of the memory array. With the control logic and sensing circuitry fabricated below the memory array, using semiconductor processing that can include complementary metal oxide semiconductor (CMOS) processing technology, CuA can be referred to as CMOS under array.

A 3D NAND memory array can include vertical strings of memory cells, using floating gate transistors or charge trap transistors, and connections from data lines positioned above the 3D NAND. Vertical connections extending through the 3D NAND memory array or through memory breaks within the 3D NAND memory array can be used to couple to sensing circuitry and other control logic of the CuA region for the memory array. A CuA architecture, which allows for circuits that operate with a 3D memory array to be structured in a space in the substrate below the 3D memory array, provides capabilities for higher densities of memory cells. These capabilities address a desire to limit increases in the area (horizontal plane) of the memory die. For continued increases in memory capacity, other design considerations can be implemented that also provide for enhancements to operation of the memory device.

Various memory device formats can be structured in a CuA architecture, such as but not limited to NOR or NAND architecture semiconductor memory arrays. Both NOR and NAND flash architecture semiconductor memory arrays are accessed through decoders that activate specific memory cells by selecting the access line coupled to their gates. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side-select-gate (SGD) line of a memory string to effectively activate the memory string. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows between the source line and the data line through each series-coupled group, restricted only by the selected memory cells of each group, placing current encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context to refer to any memory cell(s) that can store more than one bit of data per cell (i.e., that can represent more than two programmed states). The sensing and control circuitry for such NOR or NAND architecture semiconductor memory arrays can be structured beneath the respective memory array in a CuA architecture.

3D memory devices, such as NAND memory devices, can include an array of strings of memory cells arranged vertically with each memory cell of a string arranged on a horizontal tier. In selecting one or more strings for access to given memory cells, gating structures can be located at the top and bottom of these strings with the memory cells storing data therebetween. The gating structures can include a select gate transistor with its drain coupled to a data line, such as a bitline, at one end of a string and a select gate transistor with its source coupled to a source line at the other end of the string. Herein, a select gate transistor with its drain coupled to a data line is referred to as a SGD transistor and a select gate transistor with its source coupled to a source line is referred to as a select-gate-source (SGS) transistor. Each string can include one or more than one SGD transistors and one or more than one SGS transistors. Each SGD transistor and each SGS transistor can be arranged on a horizontal tier. Each memory cell can be coupled to an access line that can be on the horizontal tier of the memory cell and each SGD transistor and each SGS transistor can be coupled to a select line that can be on the horizontal tier of the respective SGD transistor and SGS transistor. The strings of the array can be constructed as pillars along which the memory cells, the SGD transistors, and the SGS transistors are structured.

Electrical signals to the memory cells and SGD transistors can be made by vertical contacts to conductive regions to the memory cells on the tier of the memory cell and vertical contacts to conductive regions to the SGD transistors on the tier of the SGD transistor. These conductive regions can be arranged in a staircase structure having stacked tiers, where the stacked tiers are arranged with conductive regions separated from each other by insulating regions longitudinally adjacent the conductive regions. The stacked tiers are structured as steps from one conductive region to a next lower conductive region, separated by an insulating region, with the next lower conductive region extending farther longitudinally than the conductive regions of above conductive regions, where the steps continue in one direction to a floor and then steps are arranged proceeding upward. The structured steps of conductive steps separated by insulating regions arranged downward and longitudinally to a floor and upward from the floor, continuing in the same longitudinal direction, form what can be defined as a stadium. A stadium has opposing staircase structures. Contacts can be arranged to selected conductive regions of the stadium. The region between opposing staircase structures of the stadium, other than the vertical contacts, is filled with insulating material. One or more stadia can be constructed for SGD transistors and separate stadia can be constructed to contact memory cells along a horizontal tier or provide conductive path to circuitry in a CUA region of the memory device. A stadium of SGD lines to contact to SGD transistors can be defined as a SGD stadium.

Pillars are typically provided as support structures adjacent the memory array structure of pillars of memory cells and SGD transistors. With increasing density, there is narrowing space to make contact to SGD transistors. Presence of cumbersome support features and contacts to SGD transistors in narrowing space can force conventional designs to elongate the SGD staircase with more complex layouts. In addition, associated with the construction of pillars in conventional memory devices, there are structural issues such as bending.

In various embodiments, a set of pillars can be dedicated for support of a SGD stadium. The set of pillars can be structured as a top portion of a pillar progression, providing an additional level to the pillar progression. A pillar progression provides support for the pillars of tiers of vertical memory cells and the one or more SGD transistors. A pillar progression is an arrangement of levels of pillars, with each pillar of one level structured on and extending vertically from a different pillar of a level on which the one level is located. In an example embodiment, the set of pillars dedicated to support the SGD stadium can be arranged as a third level of a pillar progression. In other embodiments, the dedicated SGD stadium pillars can be a second or a level higher than a third, depending on the number of levels used to provide support for the strings of the memory array structured as pillars.

The pillar progression for the memory array can be located under the SGD stadium, with the SGD stadium within the pillar arrangement that supports the SGD stadium. The horizontal extent of the SGD stadium can be entirely located within the pillar progression that includes the level of pillars for support of the SGD stadium. Alternatively, the SGD stadium can be located within at least a portion of the pillar progression. Locating the SGD stadium within the pillar progression essentially provides for a self-supporting SGD stadium. The pillar progression, used for the memory array, being placed under the SGD stadium can provide for area optimization. Conductive paths, implemented as metal paths, can be structured to reach control circuitry, such as SGD drivers, located in a CUA region of the memory device. A metal entry is a set of conductive paths for providing signals from and to circuits in a CUA region to the memory array from above the level of the memory array of the memory device. A metal entry for providing signals from and to circuits in a CUA region to the memory array can be positioned in the middle of the SGD stadium or in a non-electrical side of the SGD stadium.

The SGD stadium can be structured as the shallowest stadia of the memory device. The SGD stadium can be dedicated to the SGD tiers, which are dedicated to coupling to SGD transistors. The SGD tiers can have a thickness different from the thicknesses of access lines to memory cells. This approach to structuring a SGD stadium approach can lead to nullifying a risk of tier collapse. In addition, SGD stadium dimension reduction may be attained.

FIG. 1 illustrates an example schematic diagram of a portion of a NAND architecture semiconductor memory array 100 that can be implemented over a CUA region. The portion of the NAND architecture semiconductor memory array 100 can include a plurality of memory cells 102 arranged in a two-dimensional (2D) array of strings (e.g., first-third strings 105-107) and tiers (e.g., illustrated as respective access lines (WL) WL0-WL7 110-117, a SGD select line 125, a SGS select line 130, etc.), and sense amplifiers or devices 160. For example, the memory array 100 can illustrate an example schematic diagram of a portion of one physical page of memory cells of a 3D NAND architecture semiconductor memory device. Each string can include multiple SGD transistors, with each SGD transistor coupled to a SGD select line for the SGD transistor, and multiple SGS transistors, with each SGS transistor coupled to a SGS select line for the SGS transistor.

Each string of memory cells is coupled to a source line (SRC) 135 using a respective SGS transistor (e.g., first-third SGS 131-133), and to a respective data line (e.g., first-third data lines (BL) BL0-BL2 120-122) using a respective SGD transistor (e.g., first-third SGD 126-128). Although illustrated with 8 tiers (e.g., using access lines (WL) WL0-WL7 110-117) and three data lines (BL0-BL2 126-128) in the example of FIG. 1, other examples can include strings of memory cells having more or fewer tiers or data lines, as desired.

In a NAND architecture semiconductor memory array, such as the example memory array 100, the state of a selected memory cell 102 can be accessed by sensing a current or voltage variation associated with a particular data line containing the selected memory cell. The memory array 100 can be accessed (e.g., by a control circuit, one or more processors, digital logic, etc.) using one or more drivers. The one or more drivers can be located in a CUA region below the level of the memory array 100. In an example, one or more drivers can activate a specific memory cell, or set of memory cells, by driving a particular potential to one or more data lines (e.g., data lines BL0-BL2), access lines (e.g., access lines WL0-WL7), or select gates, depending on the type of operation desired to be performed on the specific memory cell or set of memory cells. The sense amplifiers 160, coupled to one or more of the data lines (e.g., first, second, or third data lines (BL0-BL2) 120-122), can detect the state of each memory cell in respective data lines by sensing a voltage or current on a particular data line. The sense amplifiers can be located in a CUA region below the level of the memory array 100.

In a CuA architecture for a memory die having a 3D memory array, the CuA region can include circuits for controlling the operation of the 3D memory array. One or more control circuits of the CuA can provide control signals to the 3D memory array in order to perform a read operation or a write operation on the 3D memory array. The CuA can include one or more of control circuitry, state machines, decoders, sense amplifiers, read/write circuits, and controllers. These circuits can implement one or more memory array operations including erasing, programming, or reading operations. For example, the CuA region can include an on-chip memory controller for determining row and column address, access line and data line addresses, memory array enable signals, and data latching signals. The operations on the 3D memory array are typically performed to access one or more memory cells in response to requests from other circuits on the memory die or a device external to the memory die. The CuA region can include pad structures to couple the memory array or one or more circuits in the CuA region to other portions of the die of the memory device, or to couple to devices external to the memory device.

Figure 2:
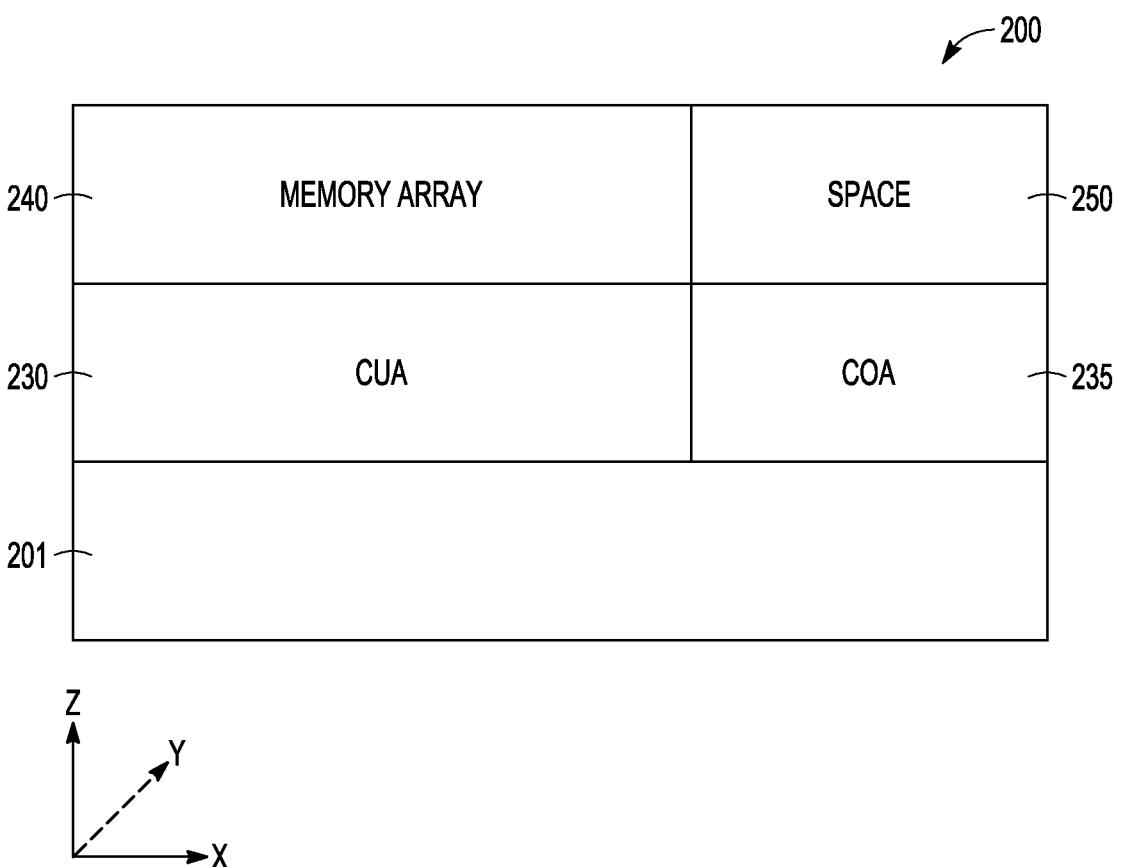
FIG. 2 is a block diagram illustrating regions of an example memory device having a three-dimensional memory array, in accordance with various embodiments.

FIG. 2 is a block diagram of regions of an embodiment of an example memory device 200 having a 3D memory array, in which the regions are shown in the z-x plane. A memory array region 240 having horizontal planes (x-y) of memory cells is disposed vertically over a CuA region 230 disposed in a substrate 201. The horizontal planes (x-y) of memory cells can be structured as multiple arranged tiers comprising memory cells. The CuA region 230 can include control circuitry for the memory array of the memory array region 240. The control circuitry in the CuA region 230 can include one or more instrumentalities to operate as a row decoder, a column decoder, a sense amplifiers, a page buffer, a selector, an input/output (I/O) circuit, and a memory control unit of memory device 200. A space 250 can be implemented adjacent the memory array region 240 and above the CuA region 230. In some embodiments, the space 250 can be implemented beyond the horizontal extent of the memory array and may not directly contain elements of the control and sensing circuitry for the memory array, which can be located in the CuA region 230. The CuA region 230 can include a space of the CuA located directly below the 3D memory array of memory array region 240 such that this space of the CuA extends at least in one direction in the x-y plane to the same extent as the 3D memory array extends in this direction. The CuA region 230 can include a region in the die outside of the horizontal extent of the 3D memory array, referred to as OA, and below a level of the 3D memory array. In various embodiments, circuits or contacts can be structured outside the horizontal extent of and below a level of the 3D memory array. The circuits in this OA region can be referred to as circuits-outside-array, CoA, in a CoA region 235. The space of the CoA can be disposed adjacent the portion of the space of the CuA region 230 that contains control circuitry for the memory array of the memory array region 240 and below the level of the 3D memory array.

With the memory device 200 having a CoA region 235 adjacent the CuA region 230 containing control circuitry for the memory array and placed below a level of the memory array in memory array region 240, the space 250 can be arranged directly over the CoA region 235. The CoA region 235 can include pads to couple to nodes for external connections or pins of the package for the memory device 200. The space 250 can also be implemented with conductive columns to couple to the top levels of the memory device 200.

Figure 3A:
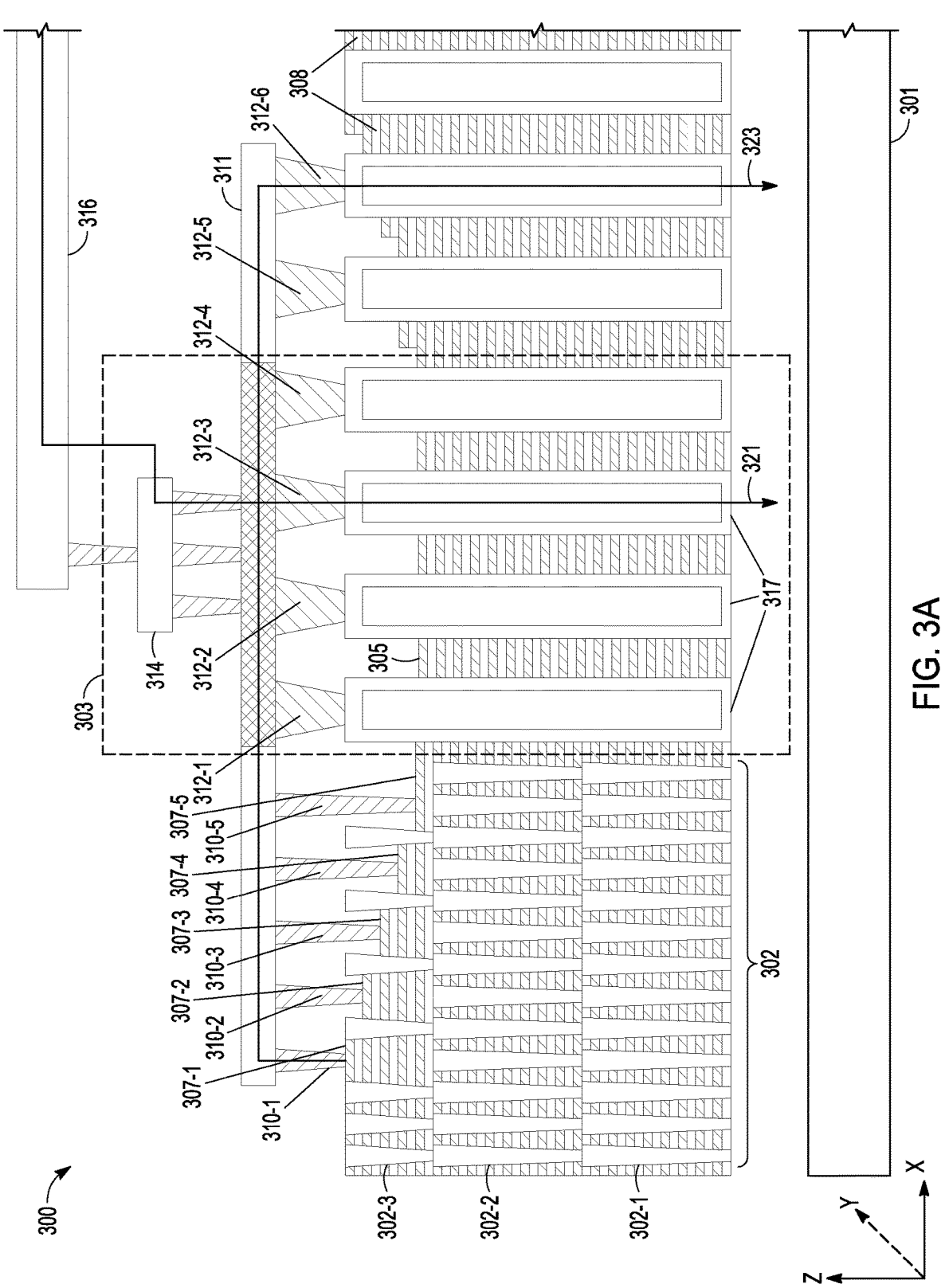
FIGS. 3A-3C represent a drain-side-select-gate stadium of a memory device located partially within a pillar progression with respect to other stadia of the memory device, in accordance with various embodiments.
Figure 3B:
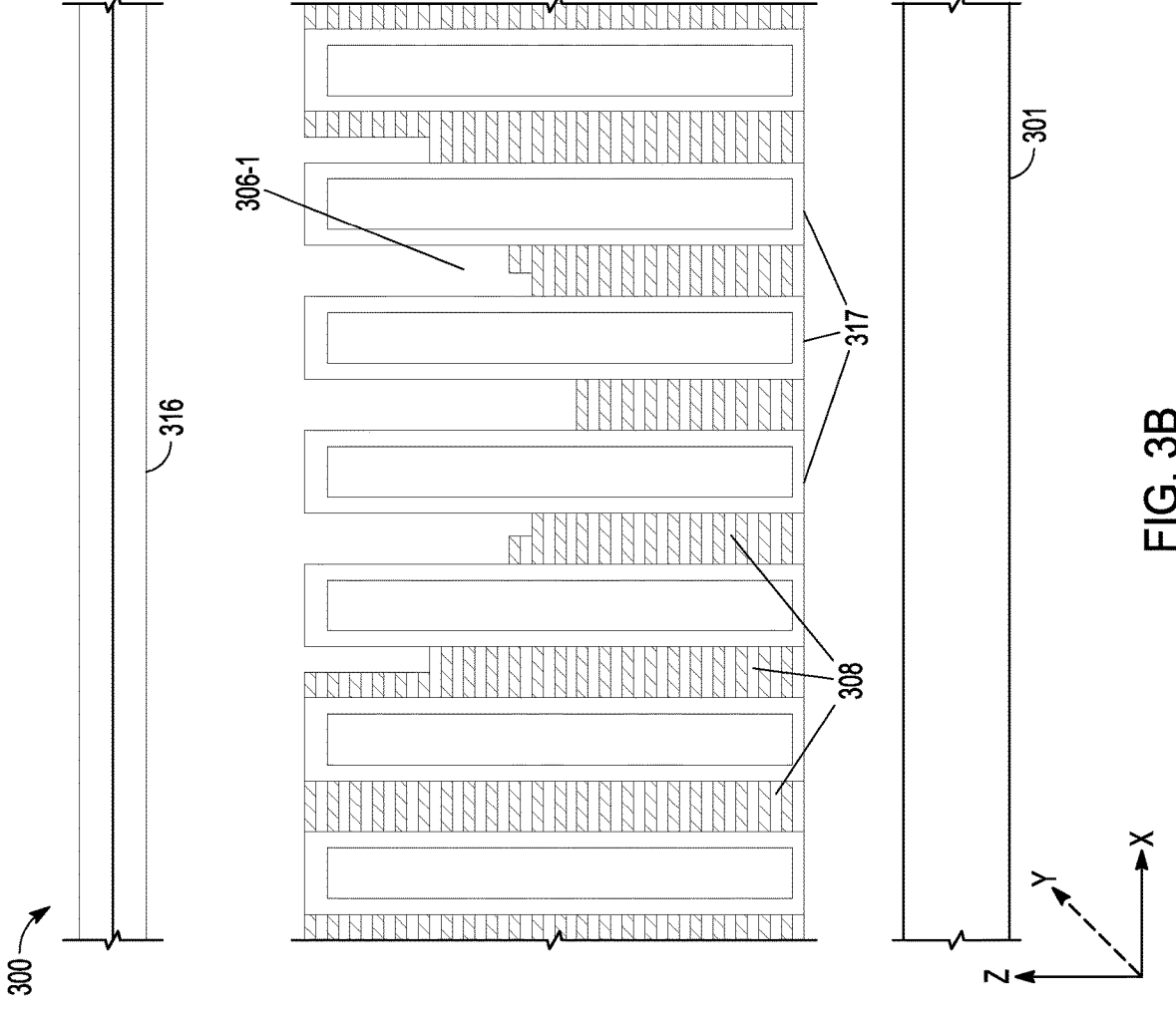
Figure 3C:
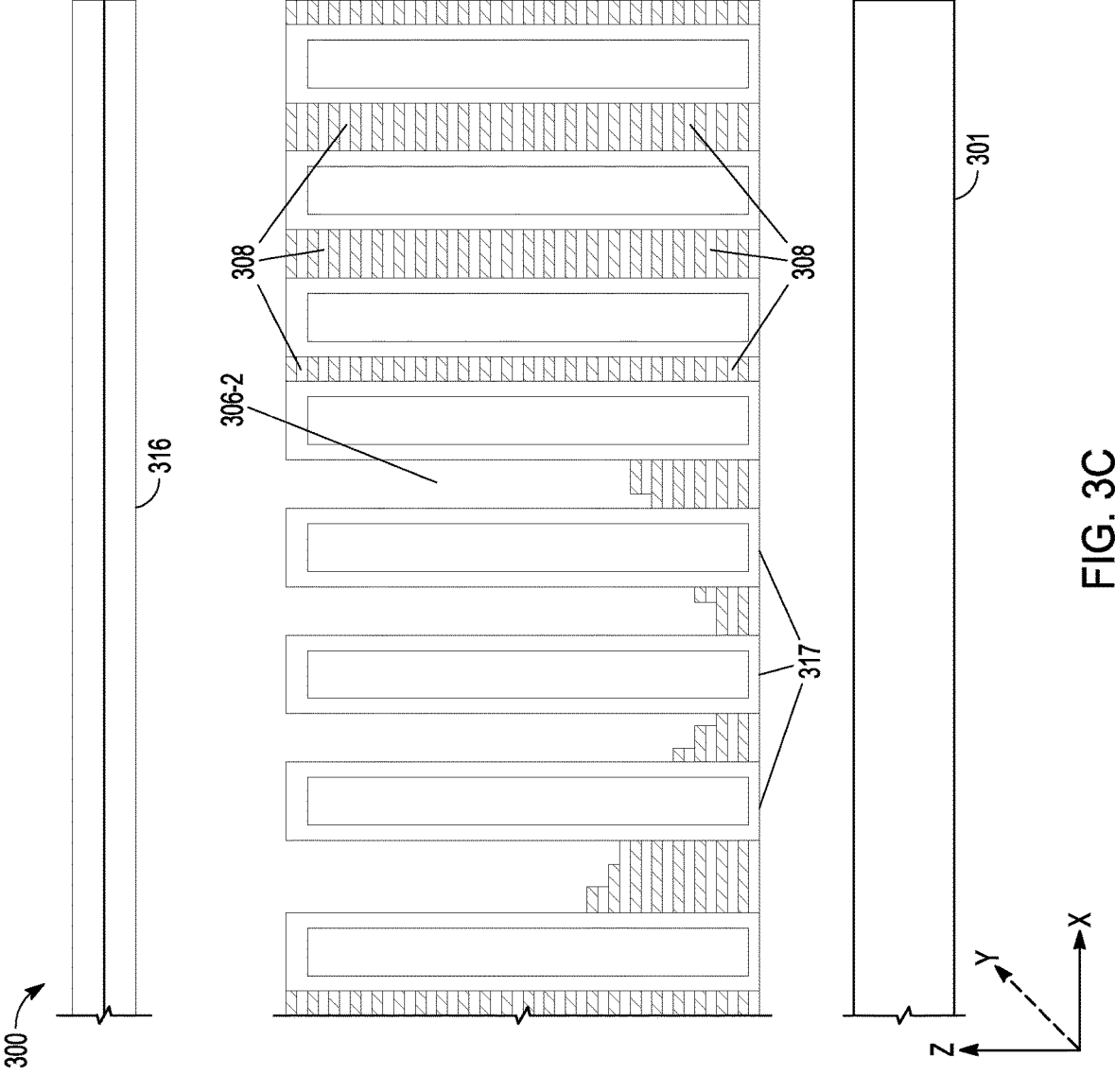

FIGS. 3A-3C represent an embodiment of an example SGD stadium 305 in a portion of a memory device 300 located partially within a pillar progression 302 with respect to other stadia 306-1 and 306-2 of the memory device 300. The memory device 300 can include a 3D array of strings of memory cells, similar to memory array 100 shown in FIG. 1, which are not shown in FIGS. 3A-3C but can be located to the left of pillar progression 302 of the memory device 300. Pillar progression 302 can include two levels 302-1 and 302-2 of pillars to support the pillar of strings for the memory cells to the left of pillar progression 302. Pillar progression 302 can include a top level 302-3 of pillars, which is a third level in this example embodiment, that is dedicated to support SGD stadium 305. The pillar progression 302 provides support for the tiers of vertical memory cells and the one or more SGD transistors associated with the memory cells. Each individual pillar of one level is structured on and extends vertically from a different individual pillar of the level on which the one level is located. As shown in FIG. 3A, the individual pillars of level 302-2 are located on individual pillars of level 302-1. Each pillar of level 302-3 is on an individual pillar of level 302-2; however, each pillar of level 302-2 does not have a pillar of level 302-3 located extending from a top of each pillar of level 302-2. In pillar progression 302, the pillars of levels 302-1 and 302-2 have a common arrangement, while the arrangement of the level of pillars 302-3 does not have a number of pillar locations, that correspond to the pillar locations of levels 302-1 and 302-2, that is, the level of pillars 302-3 skip selected pillar locations of the 302-1/302-2 arrangement. As shown in FIG. 3A, the level 302-3 of pillar progression 302 has selected pillars with respect to the pattern of pillars of levels 302-1 and 302-2.

The portion of memory device 300 of FIG. 3 includes tiers of access lines 304-1 . . . 304-14 for memory cells of memory device 300 and tiers of SGD select lines 307-1 . . . 307-5. Each SGD select line of SGD select lines 307-1 . . . 307-5 is on a step (tier) of stadium 305 different from the other SGD select lines of SGD select lines 307-1 . . . 307-5 of stadium 305. Each access line of the set of access lines can be separated from adjacent access lines by an insulating region 308, and each select line of the set of SGD select lines can be separated from adjacent select lines by an insulating region 308. Insulating regions 308 can include an insulating oxide such as silicon oxide and both access lines and SGD select lines can include a conductive material, such as but not limited to tungsten. Metal contacts 310-1 . . . 310-5 connect to SGD select lines 307-1 . . . 307-5 in SGD stadium 305 in the portion of SGD stadium 305 within pillar progression 302.

Thru-vias 317 provide passage for transmitting electrical signals from levels above the memory array of memory device 300 to levels below the memory array. The levels below the memory array are part of a CUA region 301 of memory device 300 that can include drivers to send signals to memory cells and SGD drivers to send signals to SGD transistors of memory strings of memory device 300. A metallization level 311 can include wiring routes to pass signals, such as signal 323, between SGD select lines 307-1 . . . 307-5 and circuits, such as SGD drivers, in CUA region 301 using metals contacts such as metal contacts 312-5 and 312-6 between metallization level 311 and a pair of thru-vias 317. Metallization level 311 can include wiring routes to pass signals, such as signal 321, from a higher metallization level 316 through an intermediate metallization level 314 to CUA region 301 using metal contacts 312-1 . . . 312-4 between metallization level 311 and four thru-vias 317. Metal contacts 312-1 . . . 312-4 and four thru-vias 317 provide a metal entry 303 for routing signals above the memory array of memory device 300 to circuits in CUA region 301 of memory device 300. Though FIGS. 3A-3C show a number of structural components of memory device 300, memory device 300 can have more or less structural components.

Figure 4:
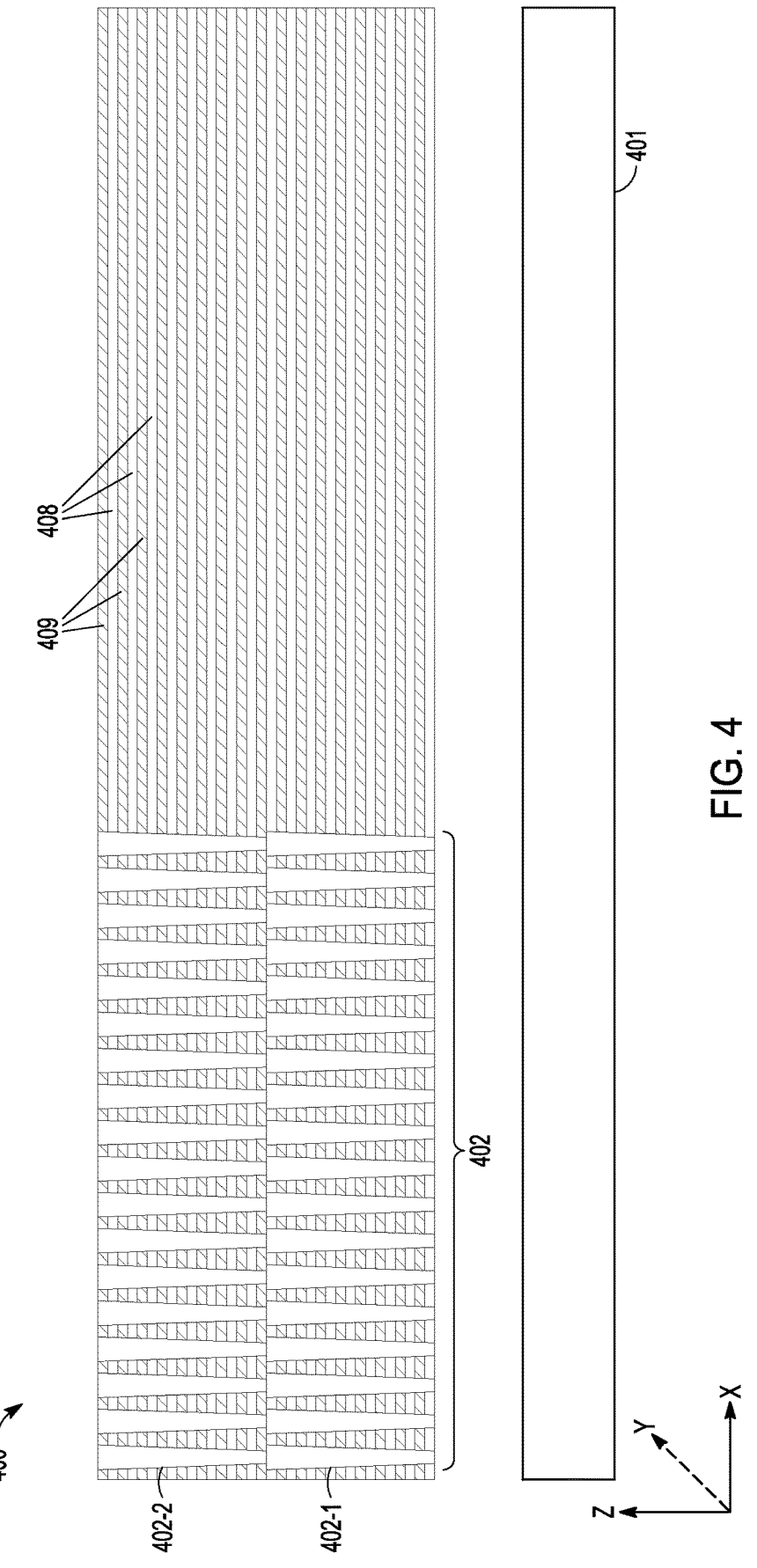
FIGS. 4-11B illustrate an example process flow of fabricating portions of a memory device with a drain-side-selectgate stadium located within a pillar progression, in accordance with various embodiments.

FIGS. 4-11B illustrate an embodiment of an example process flow of fabricating portions of a memory device with a SGD stadium located within a pillar progression. FIG. 4 illustrates a cross-sectional view of a structure 400 after processing a set of pillars 402 in alternating regions 409 and 408 of insulating material above a CUA region 401 of a substrate of the memory device. Pillars for a 3D array of strings of memory cells, similar to memory array 100 shown in FIG. 1, which are not shown in FIG. 4, have been formed located to the left of the set of pillars 402, where the set of pillars 402 form initial levels of a pillar progression for the memory device being fabricated. With respect to the pillar lattice of the memory array and the lattice of the set of pillars 402, pillars belonging to the memory array, which are electrically active, and the set of pillars 402, which are not electrically active, can be distinguished by the connection to data lines (BLs) in the final formation. In various embodiments, there are no other differences between array pillars and the lattice of the set of pillars 402 in that their level placement and construction are the same. An exception can include a slight lattice modification made to compensate a bending of the last pillars formed.

The set of pillars 402 includes two levels 402-1 and 402-2 of pillars to support the pillar of strings for the memory cells to the left of the set of pillars 402. Each individual pillar of one level is structured on and extending vertically from a different individual pillar of the level on which the one level is located. As shown in FIG. 4, the individual pillars of level 402-2 are located on individual pillars of level 402-1. In the set of pillars 402, the pillars of levels 402-1 and 402-2 have a common arrangement. The set of pillars 402 can be formed including polysilicon. Region 408 can include an insulating oxide such as silicon oxide. Region 409 can include an insulating nitride such as silicon nitride. Other insulating material can be used.

Figure 5A:
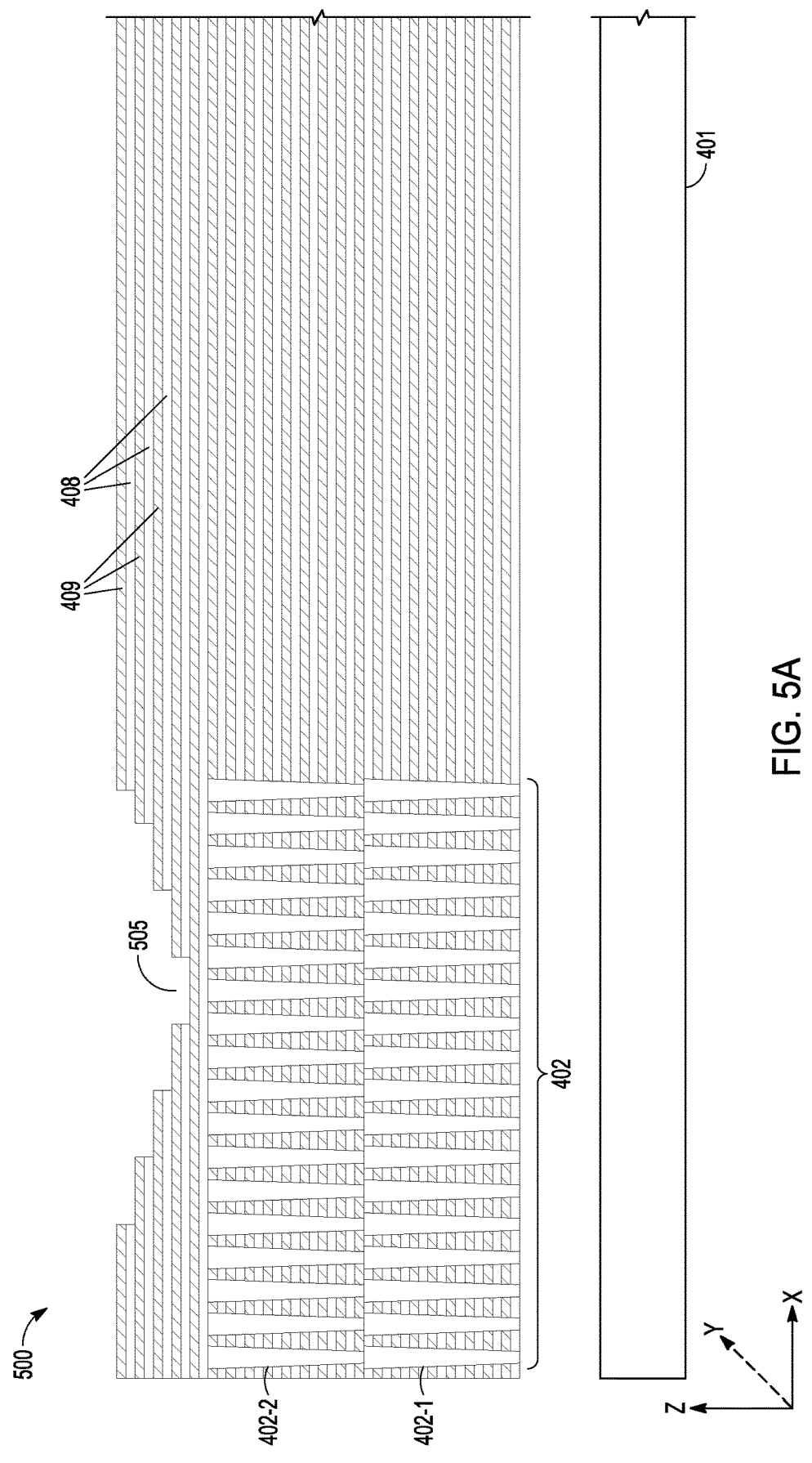
Figure 5B:
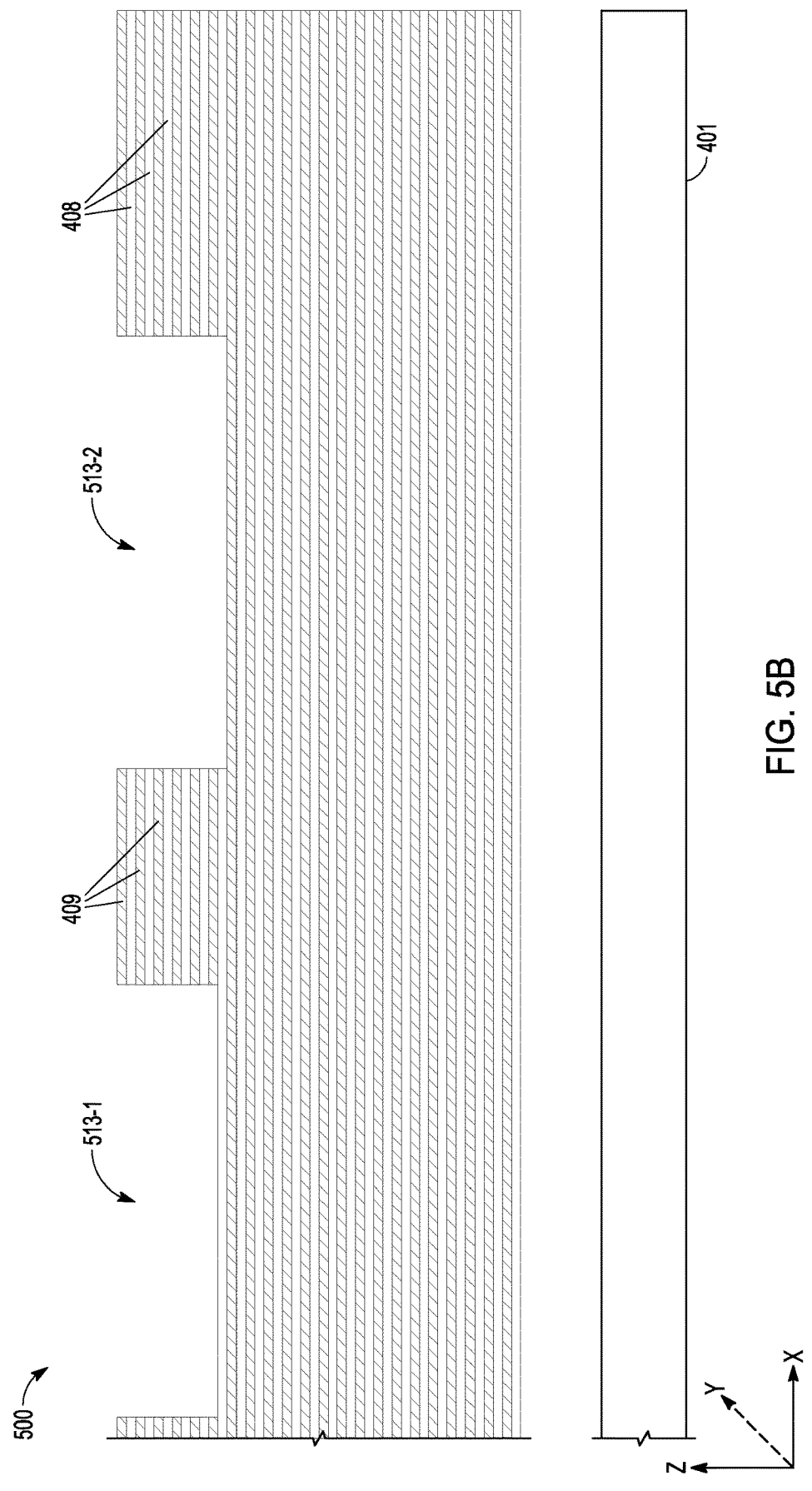

FIG. 5A-5B illustrate a cross-sectional view of a structure 500 after processing structure 400 of FIG. 4. A stadium 505 has been formed within the lateral (horizontal) extent of the set of pillars 402. Stadium 505 has been formed by removing portions of selected regions 408 and selected regions 409. The removal can be conducted by one or more removal mechanisms appropriate for the materials of regions 408 and 409. The one or more removal mechanisms can include etching using appropriate masks, which can include selective etching. Regions 513-1 and 513-2 have been opened to form additional stadia.

Figure 6A:
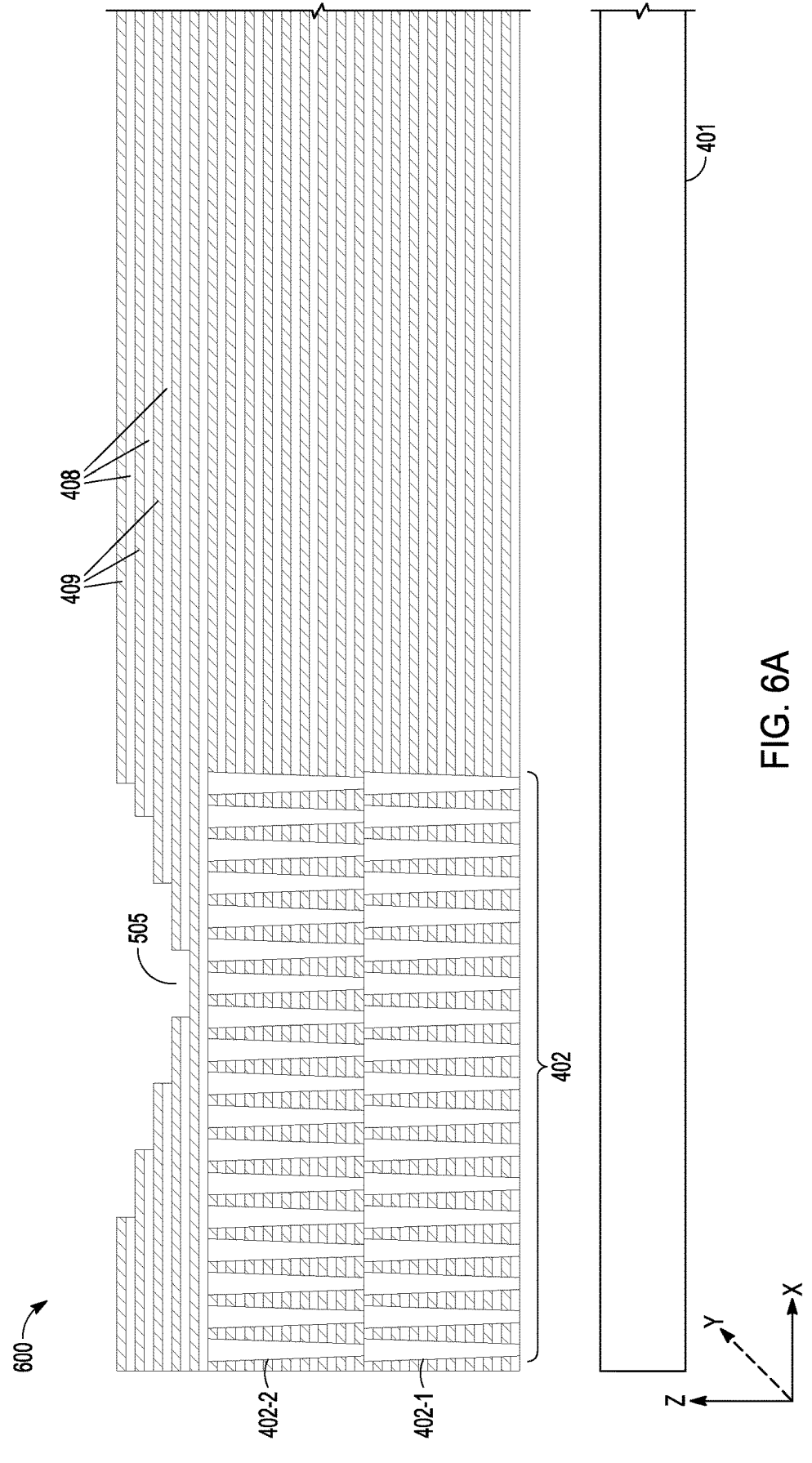
Figure 6B:
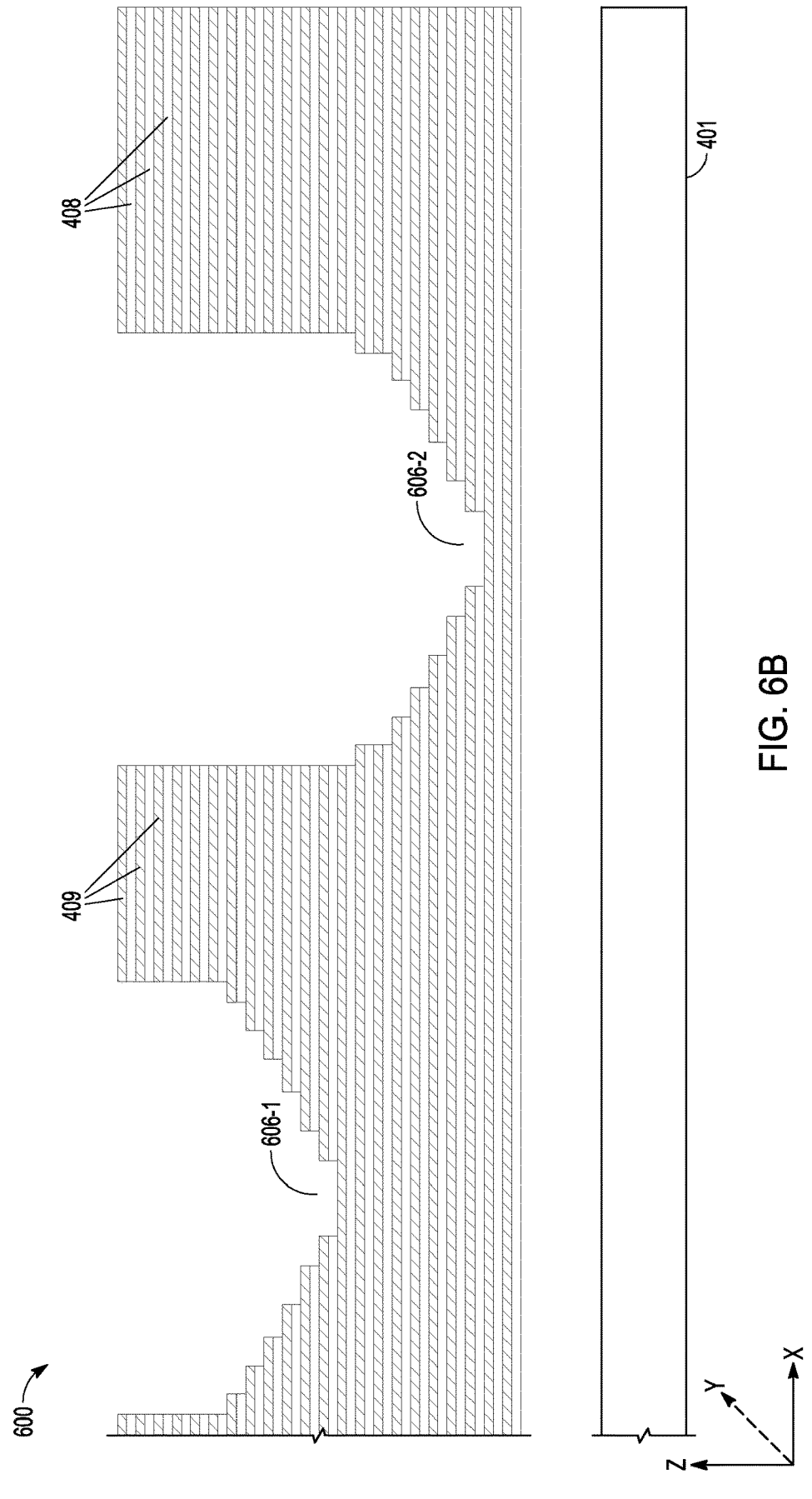

FIGS. 6A-6B illustrate a cross-sectional view of a structure 600 after processing structure 500 of FIGS. 5A-B.

Stadia 606-1 and 606-2 have been formed at regions 513-1 and 513-2 of structure 500 by further removing portions of regions 408 and regions 409. The removal can be conducted by one or more mechanisms appropriate for the materials of regions 408 and 409. The one or more mechanisms can include etching using appropriate masks, which can include selective etching.

Figure 7A:
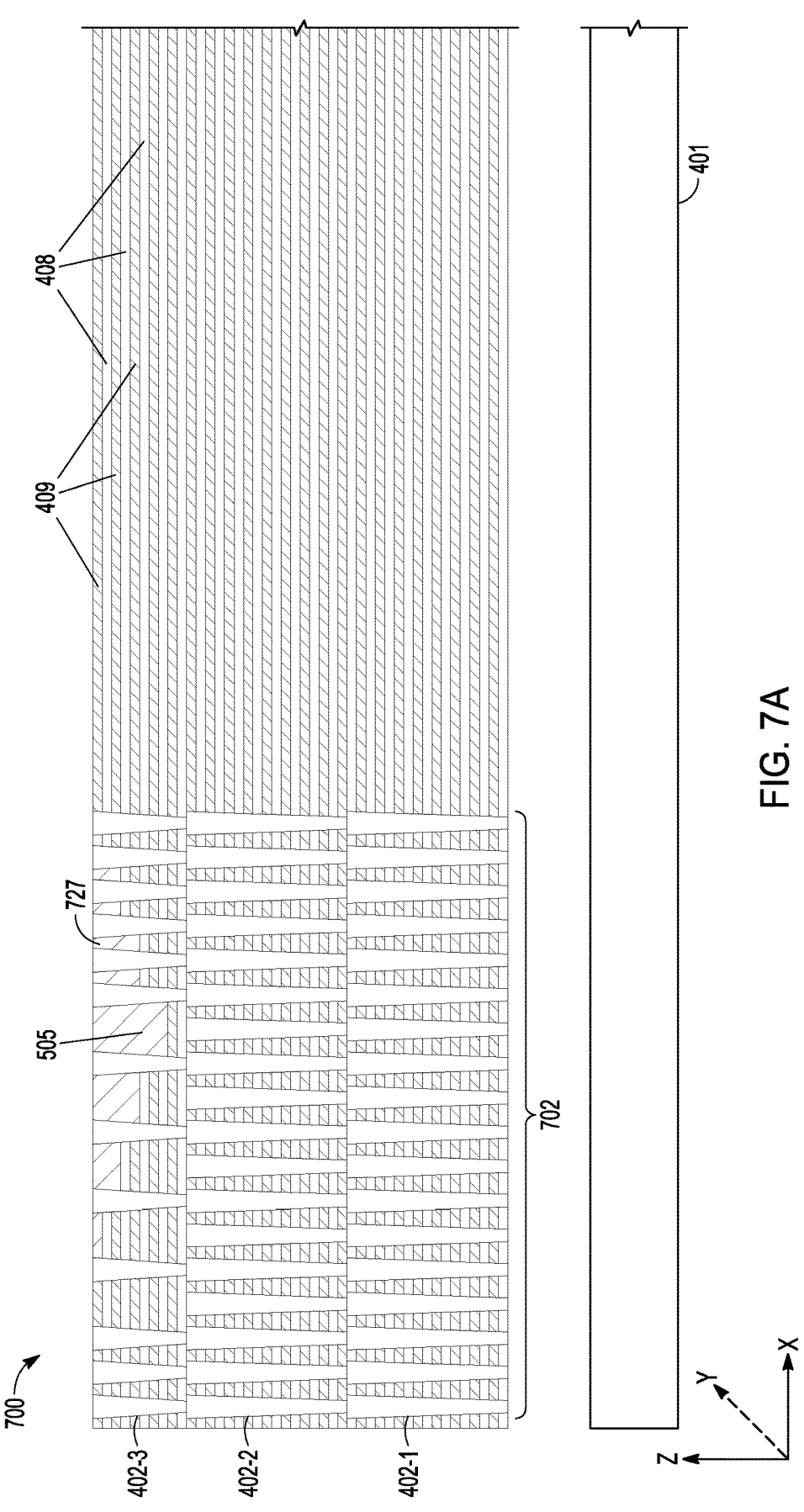
Figure 7B:
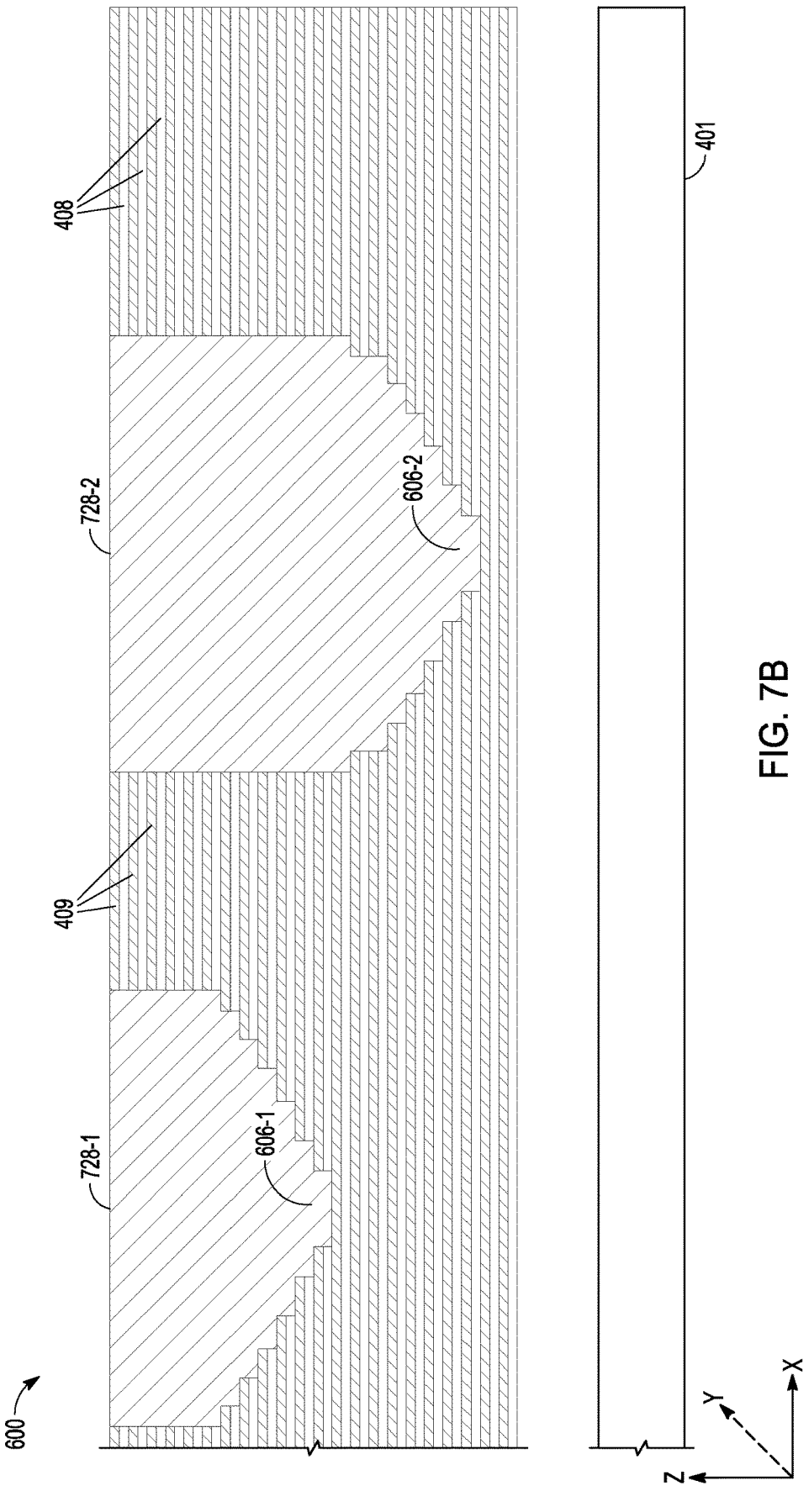

FIGS. 7A-7B illustrate a cross-sectional view of a structure 700 after processing structure 600 of FIGS. 6A-6B. An additional set of pillars 402-3 have been formed on the level of pillars 402-2, forming a pillar progression 702. The additional set of pillars 402-3 is formed corresponding to stadium 505. The additional set of pillars 402-3 is a top level pillar progression 702, where the additional set of pillars 402-3 is dedicated to support stadium 505, which will be a stadium dedicated to select lines for SGD transistors in the strings of memory cells of a memory array of the memory device being formed. The pillar progression 702 provides support for the tiers of vertical memory cells and the one or more SGD transistors associated with the memory cells. Each individual pillar of one level is structured on and extending vertically from a different individual pillar of the level on which the one level is located.

As shown in FIG. 7A, the individual pillars of level 402-2 are located on individual pillars of level 402-1. Each pillar of level 402-3 is on an individual pillar of level 402-2; however, each pillar of level 402-2 does not have a pillar of level 402-3 located extending from a top of each pillar of level 402-2. In pillar progression 702, the pillars of levels 402-1 and 402-2 have a common arrangement, while the arrangement of the level 402-3 of pillars does not have a number of pillar locations, that correspond to the pillar locations of levels 402-1 and 402-2, that is, the level 402-3 of pillars skip selected pillar locations of the 402-1/402-2 arrangement. As shown in FIG. 7A, the level 402-3 of pillar progression 702 has selected pillars with respect to the pattern of pillars of levels 402-1 and 402-2. A dielectric 727 has been formed in stadium 505 between steps on opposite sides of stadium 505 in regions not including pillars of level 402-3. A dielectric 728-1 has been formed in stadium 606-1 between steps on opposite sides of stadium 606-1 and a dielectric 728-2 has been formed in stadium 606-2 between steps on opposite sides of stadium 606-2. Dielectrics 727, 728-1, and 728-2 can be an insulating oxide such as silicon oxide. Other insulting materials other than silicon oxide can be used, depending on the materials used in forming the memory device.

Figure 8A:
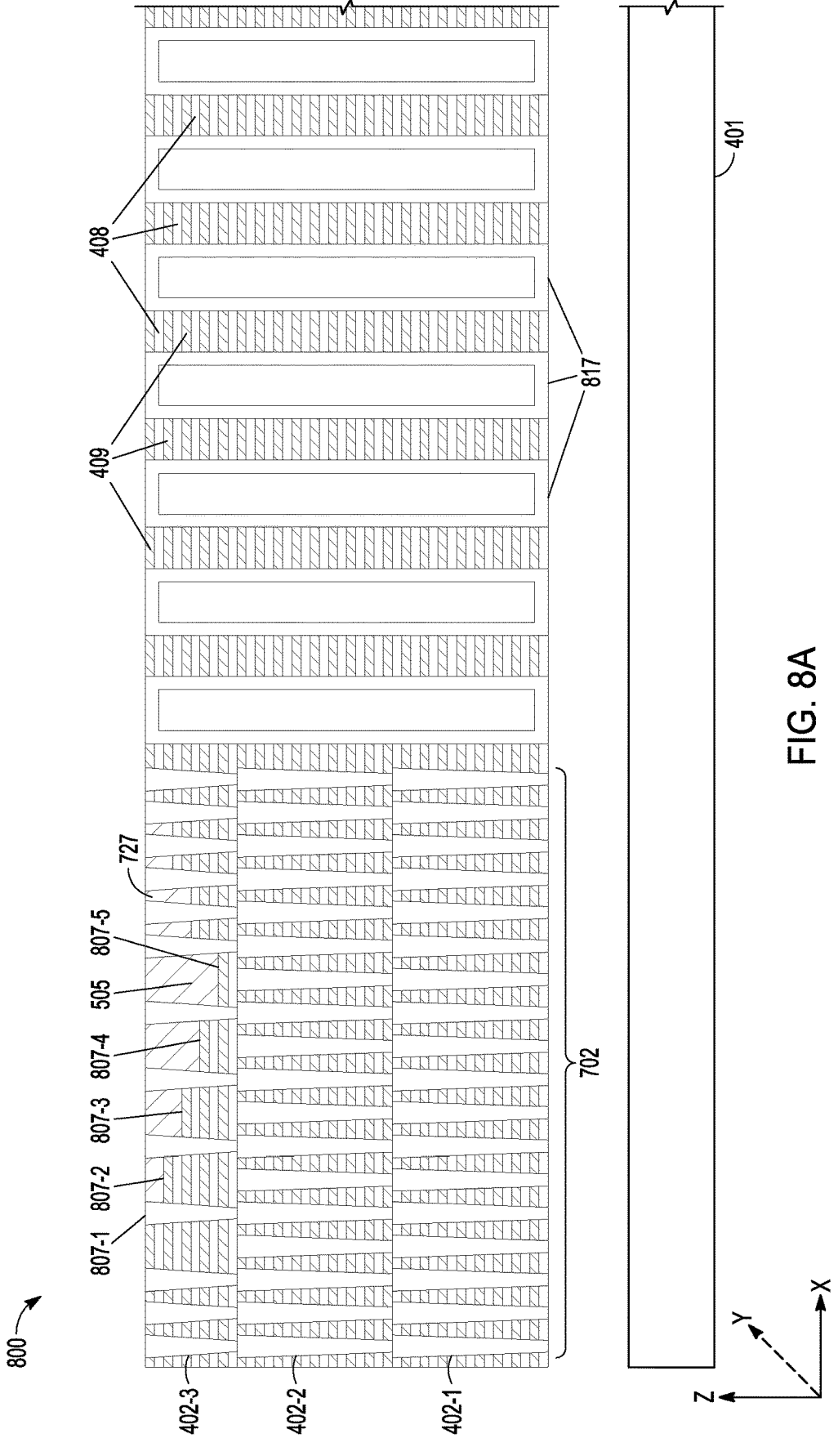
Figure 8B:
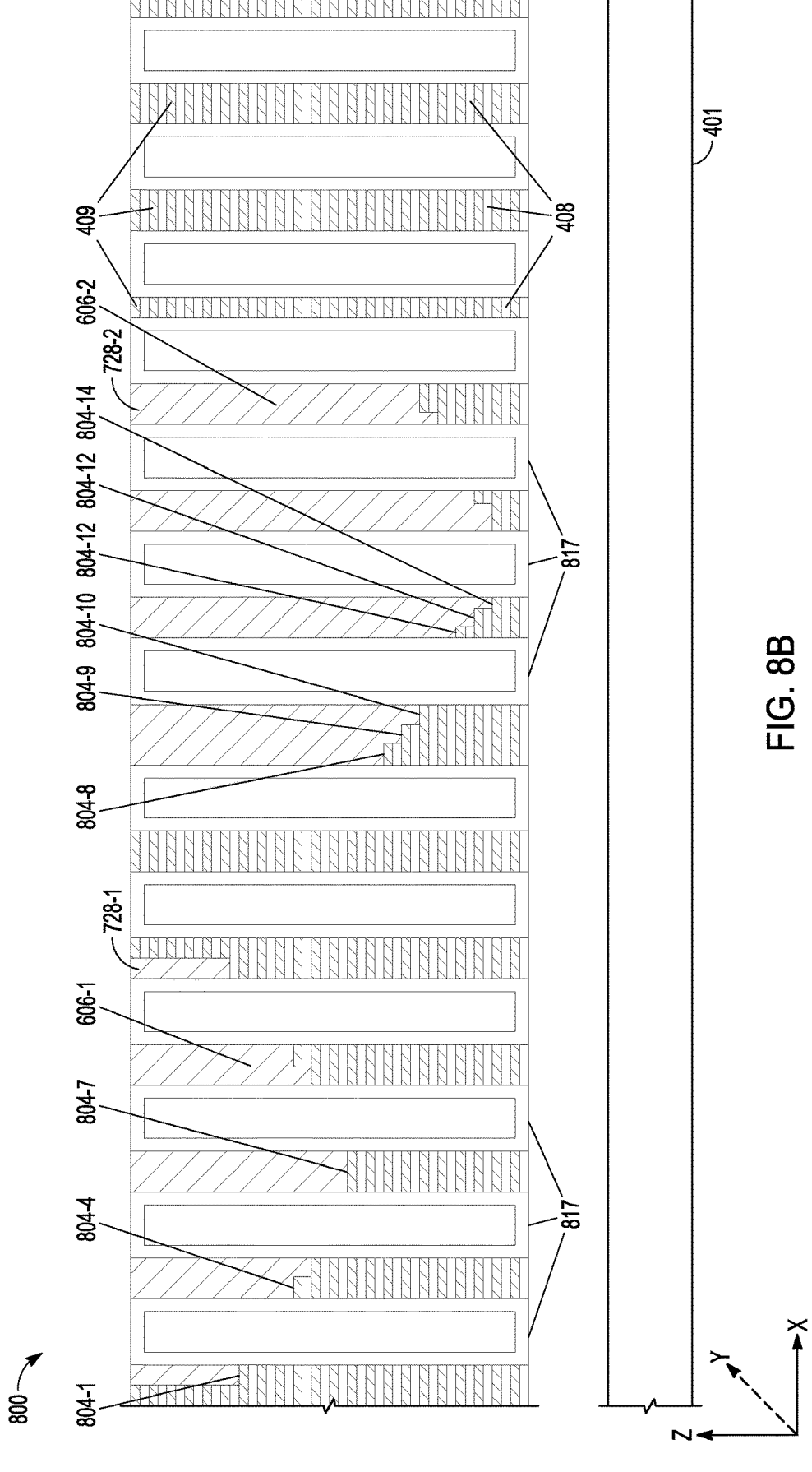

FIGS. 8A-8B illustrate a cross-sectional view of a structure 800 after processing structure 700 of FIGS. 7A-7B. A gate placement procedure has been performed to form the control gates to the memory cells in the pillars of the strings of the memory array. A replacement gate process can include forming gates in a process in which an initially formed region, having material such as silicon nitride, is removed and replaced by conductive material forming a gate in each of a number of memory cells in a vertical string in a pillar. The replacement gates may be coupled to access lines, for example word lines, or may be formed as part of the access lines. Regions 409 have been removed and replaced by conductive material to form SGD select lines 807-1 . . . 807-5 and access lines 804-1 . . . 804-14, though access lines 804-2, 804-3, 804-5, 804-6, 804-11, and 804-13 are not labeled for ease of presentation. SGD select lines 807-1 . . . 807-5 are formed as steps in stadium 505, while access lines 804-1 . . . 804-7 are steps in stadium 606-1 and access lines 804-8 . . . 804-14 are steps in stadium 606-2. The conductive material can be, but is not limited to, tungsten.

Figure 9A:
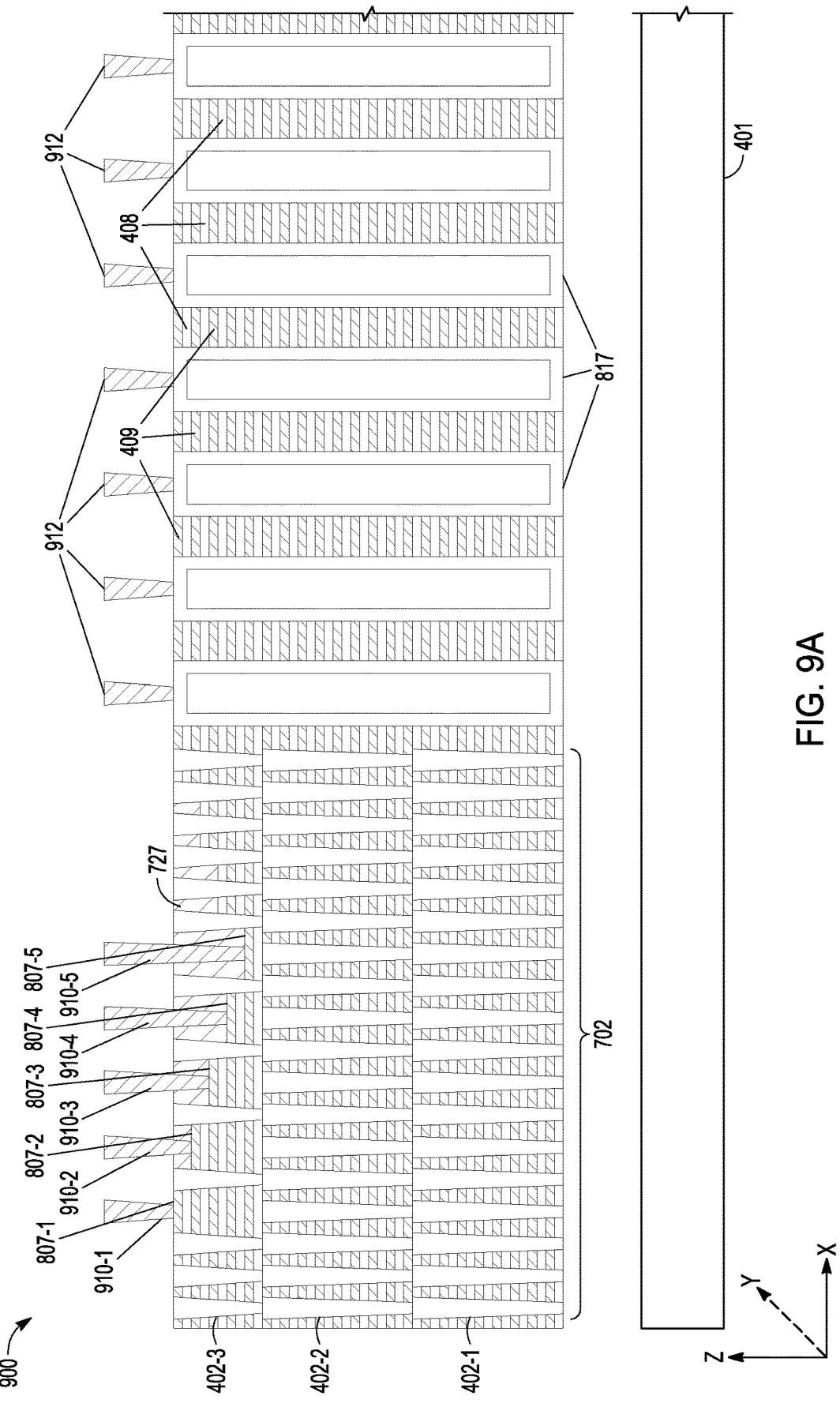
Figure 9B:
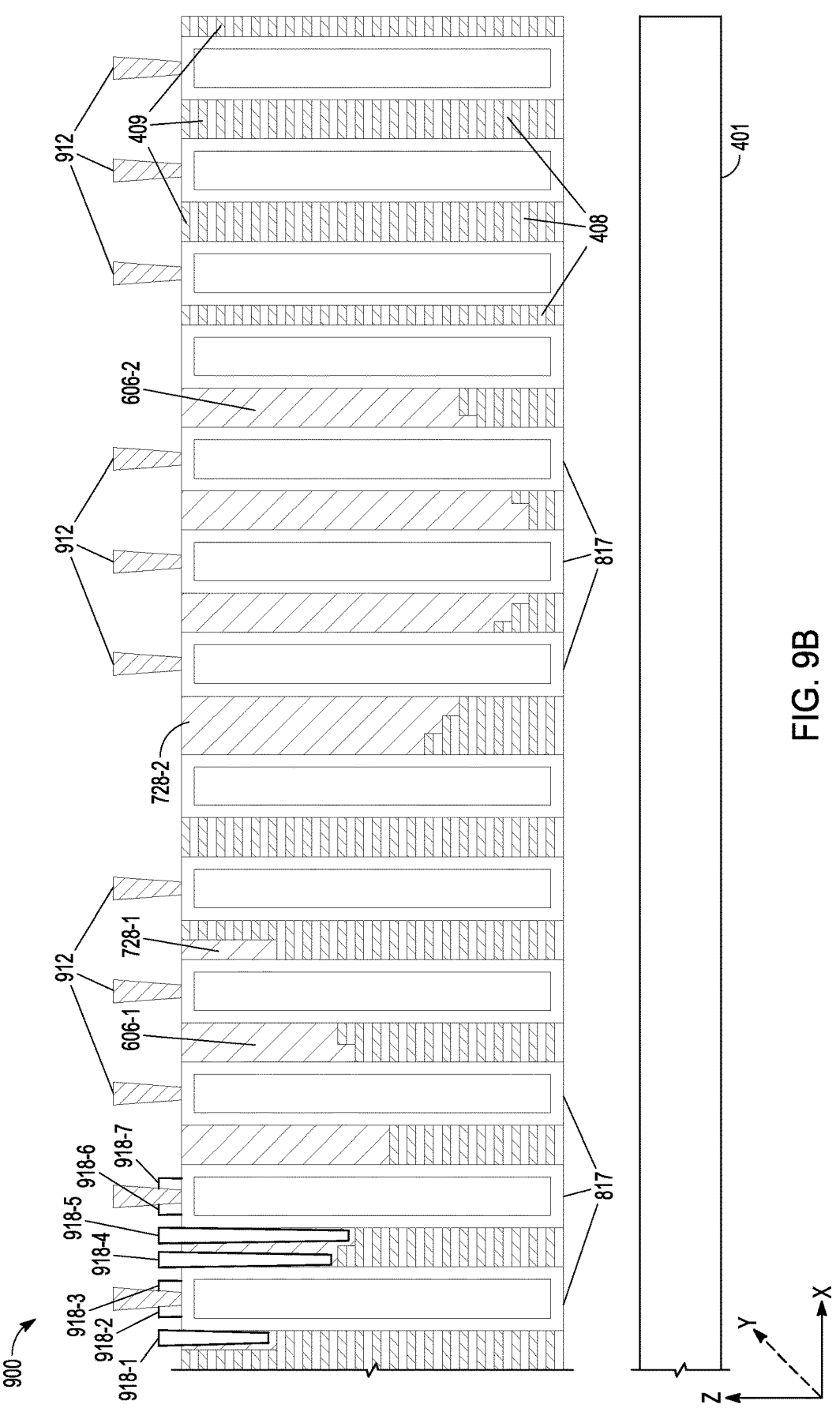

FIG. 9A-9B illustrate a cross-sectional view of a structure 900 after processing structure 800 of FIGS. 8A-8B. Contacts 910-1 . . . 910-5 have been made to SGD select lines 807-1 . . . 807-5, respectively, in stadium 505, and contacts 918-1 . . . 918-7 have been made to access lines 804-1 . . . 804-7, respectively, in stadium 606-1. Contacts have been made to access lines 804-8 . . . 804-14, respectively, in stadium 606-2, but are not shown for ease of presentation. Contacts 912 have been formed to thru-vias 817. The processing can be performed in a number of different manners, including combinations of techniques. In various embodiments, contacts 910-1 . . . 910-5 can be defined at the same time in the process flow as contacts 912. In other embodiments, contacts 910-1 . . . 910-5 can be formed at the same time in the same procedures conducted with the formation of contacts 918-1 . . . 918-7. In various embodiments, formation of contacts 910-1 . . . 910-5, contacts 912, contacts 918-1 . . . 918-7, or other components at this stage of processing or other stages can be performed with one or more dedicated masks, as appropriate.

Figure 10A:
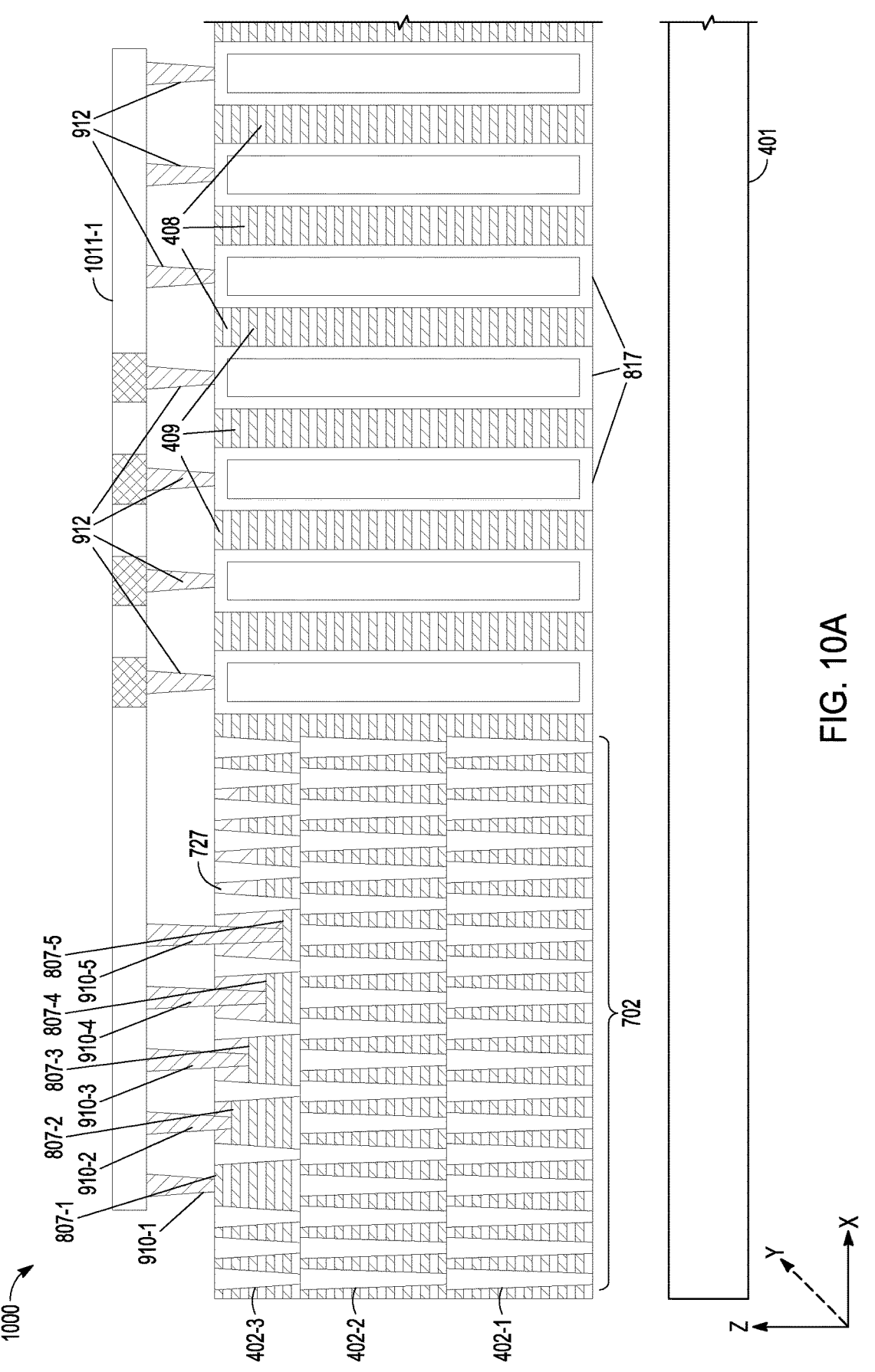
Figure 10B:
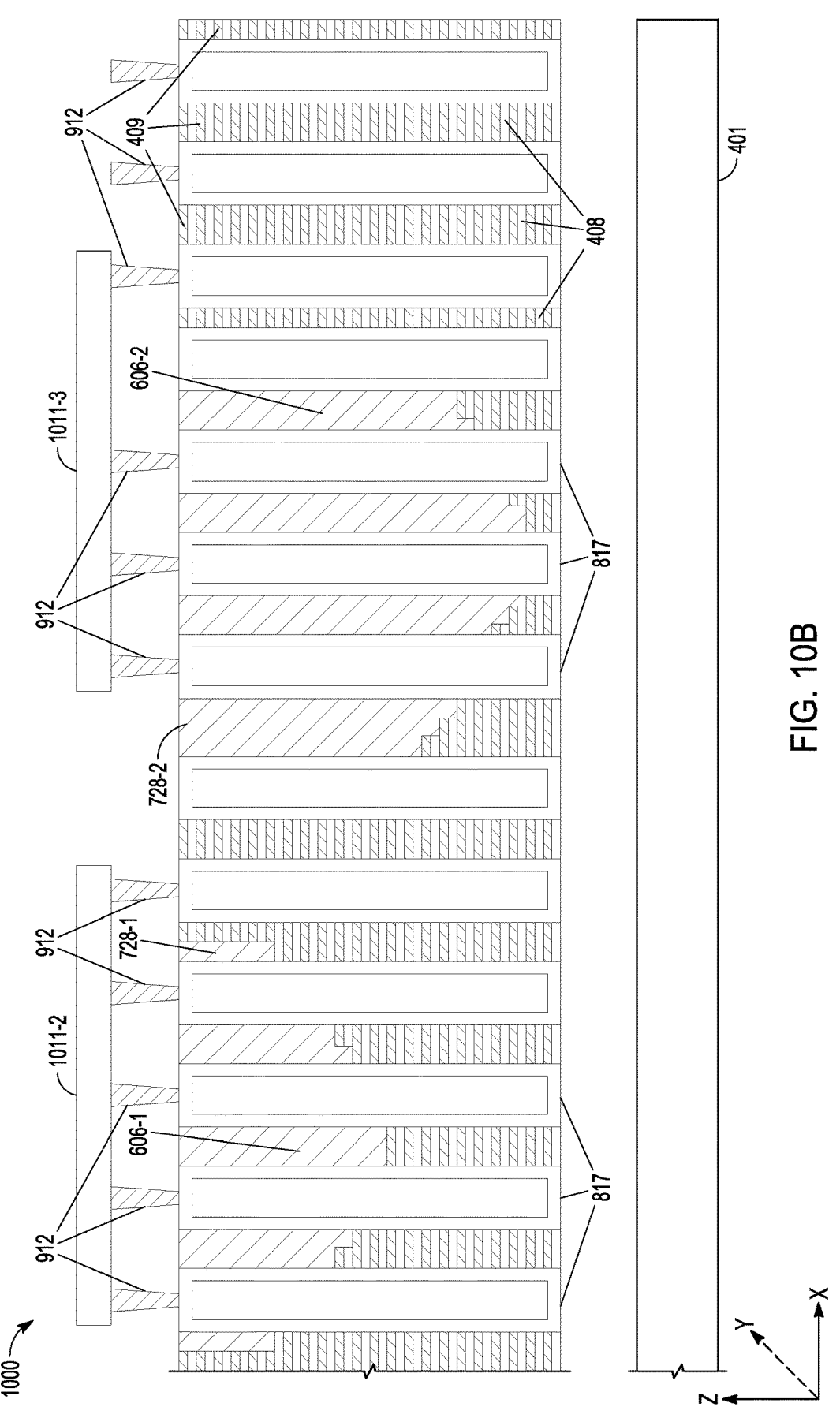

FIG. 10A-10B illustrate a cross-sectional view of a structure 1000 after processing structure 900 of FIGS. 9A-9B. Metallizations levels 1011-1, 1011-2, and 1011-3 have been formed to route signals from levels above the memory array of the memory device, being formed, to circuits located in CUA region 401 below the level of the memory array. For ease of presentation, not all of the components of FIGS. 8A-8B and 9A-9B have not been repeated.

Figure 11A:
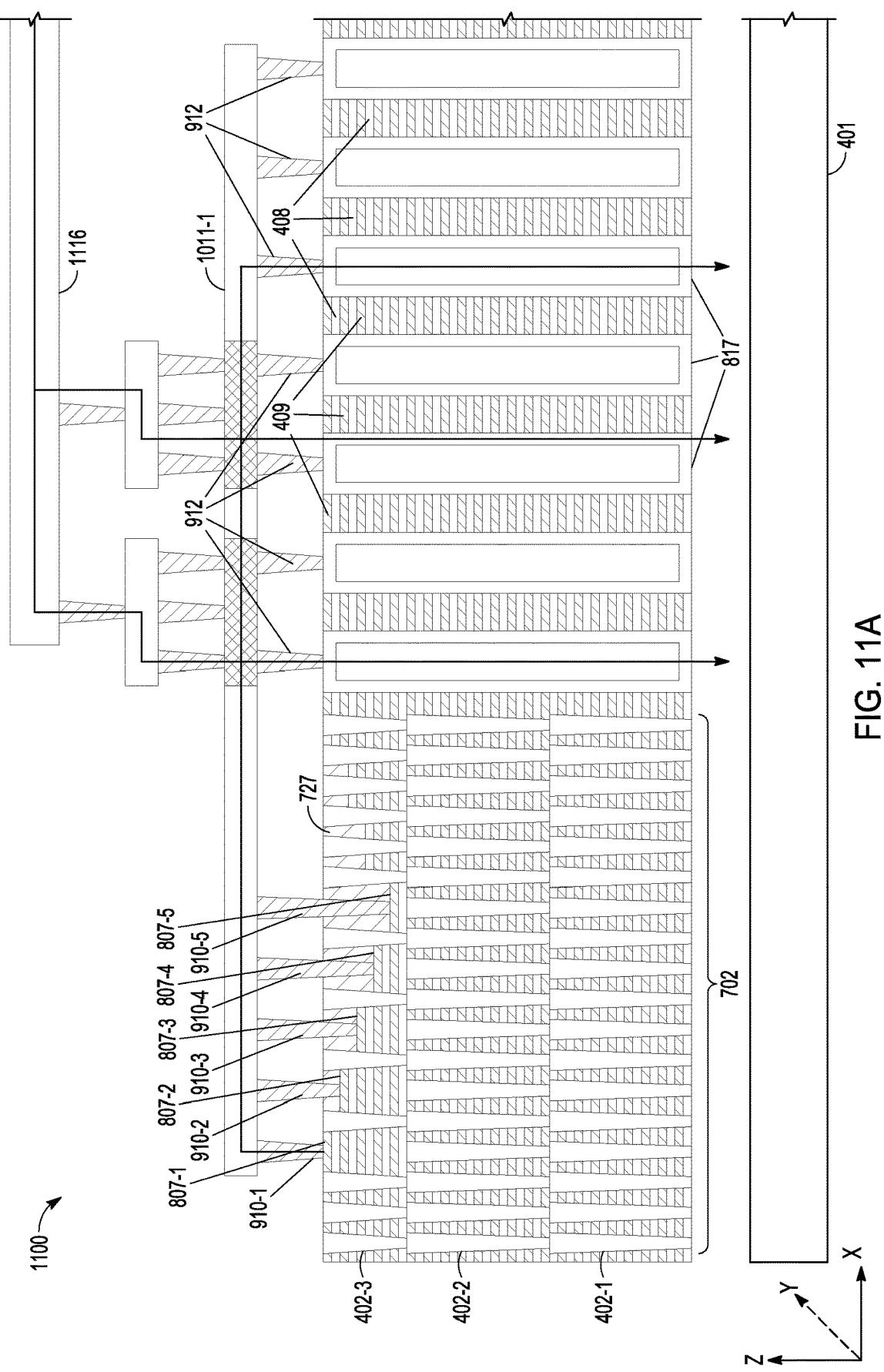
Figure 11B:
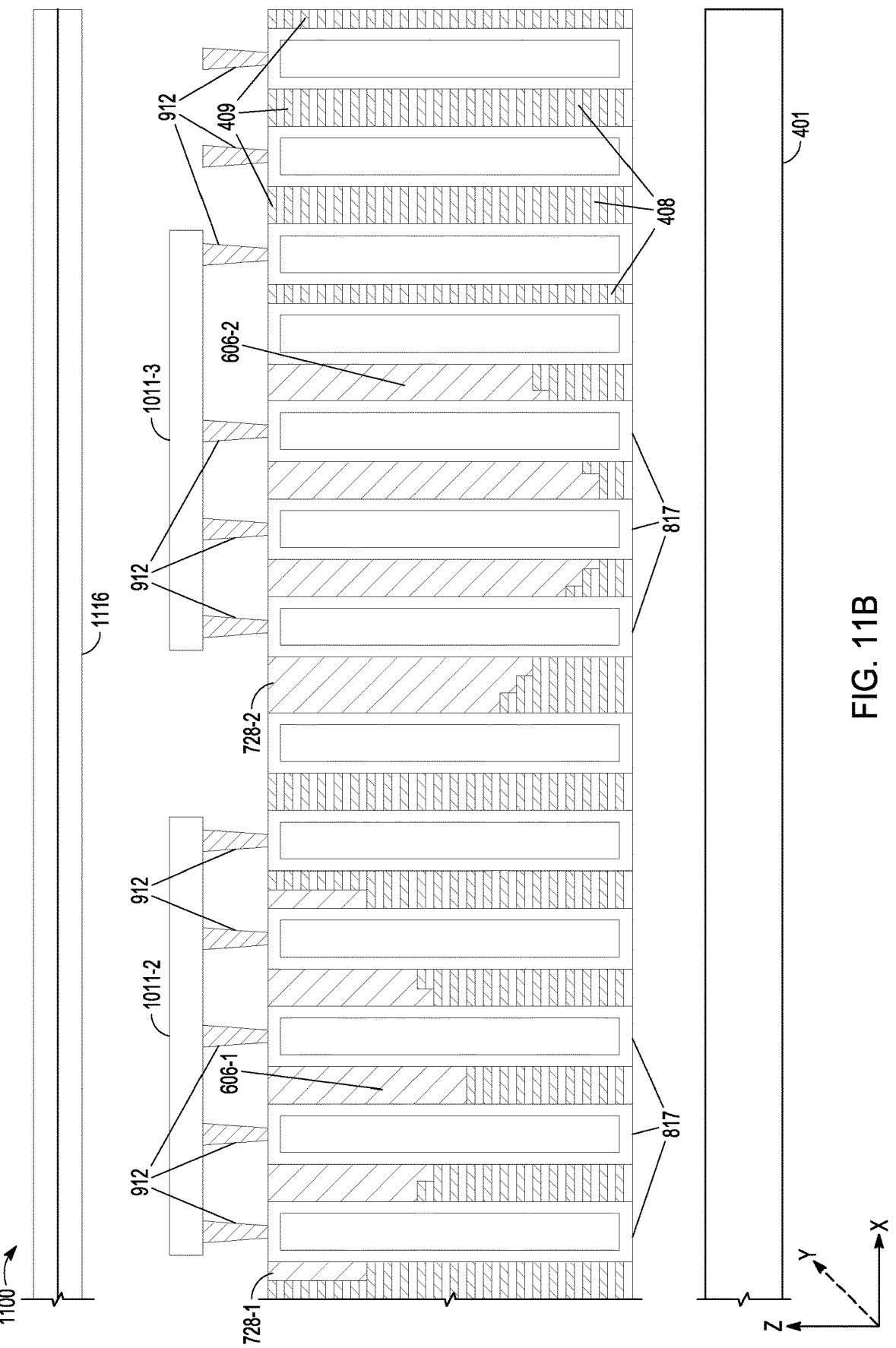

FIGS. 11A-11B illustrate a cross-sectional view of a structure 1100 after processing structure 1000 of FIGS. 10A-10B. A higher metallization level 1116 has been formed to route signals from a level above metallizations levels 1011-1, 1011-2, and 1011-3 to circuits located in CUA region 401 below the level of the memory array. For ease of presentation, not all of the components of FIGS. 8A-10B have not been repeated. Structure 1100 includes stadium 505 that contains SGD select lines 807-1 . . . 807-5, which are dedicated to SGD transistors of the memory array coupled to the SGD select lines 807-1 . . . 807-5, where stadium 505 is entirely within the horizontal extent of pillar progression 702. In particular, stadium 505 is entirely within the horizontal extent of level 402-3 of pillar progression 702 and is above level 402-2 of pillar progression 702.

Various deposition techniques for components of structures 400-1100 in the process flow of FIGS. 4-11B can be used that are typical for the material being formed, the dimensions of the material being formed, and the architecture in which the material is being formed in the fabrication of the memory device. Material and structures can be formed by suitable processes such as, but not limited to, deposition processes including but not limited to physical vapor deposition (PVD), chemical vapor deposition (CVD), atomic layer deposition (ALD), or other deposition process. Other processes can be used. Selective etching can be used to remove selected regions in the processing discussed with respect to FIGS. 4-11B. Selective etching is a process in which one or more materials are removed from a structure, while one or more other materials remain in the structure with no or little removal. Selective etching can depend on the material to be etched, the material not to be etched, the etchant employed, and the method for etching. Types of etching include wet etching and dry etching, where each of these two basic methods include a number of different etching procedures. In addition, conventional masking techniques, providing protective regions in the processing, can be used in removal of selected regions in forming the components of the memory device.

Figure 12A:
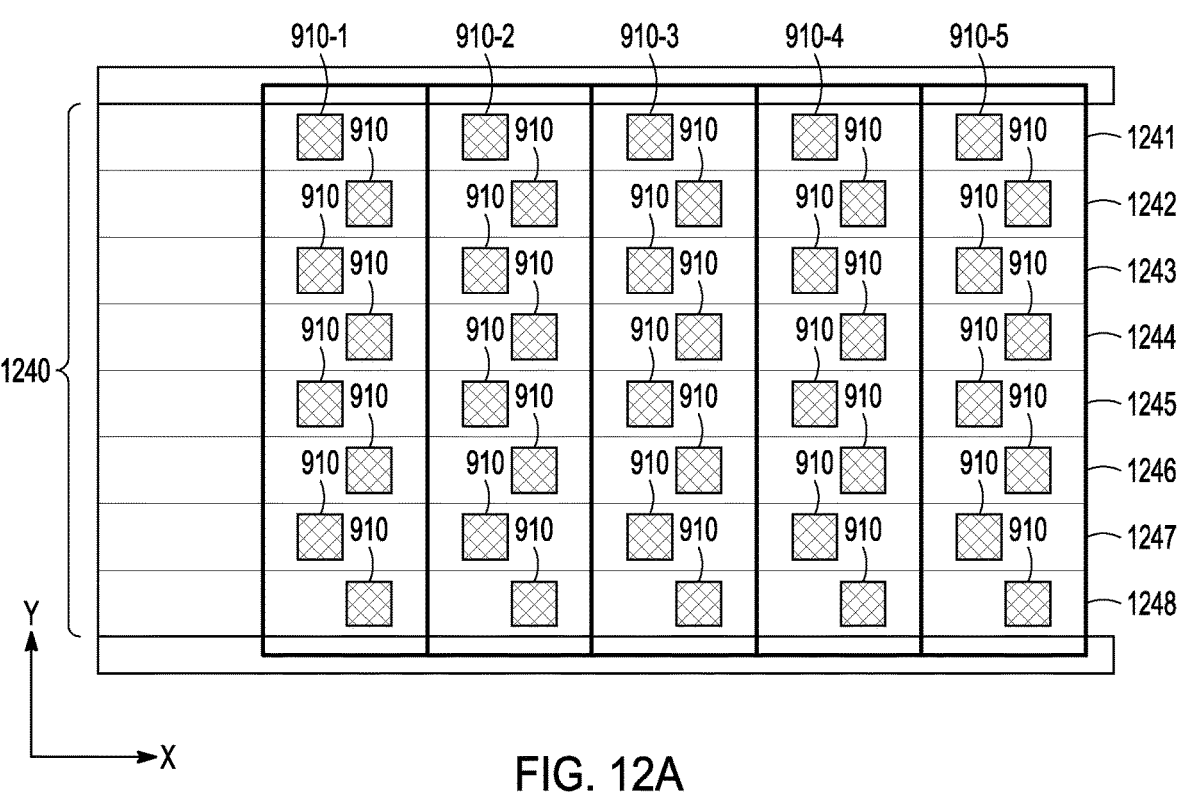
FIG. 12A is a top view of the example structure of FIG. 9A having a block of drain-side-select-gate contacts, in accordance with various embodiments.

FIG. 12A is a top view of an embodiment of structure 900 of FIGS. 9A-9B having a block 1240 of SGD contacts. The top view is in the x-y plane. Block 1240 of SGD contacts is structured having sub-blocks 1241, 1242, 1243, 1244, 1245, 1246, 1247, and 1248 of SGD contacts. Though eight sub-blocks are shown, a block of SGD contacts, such as block 1240, can have more or less than eight sub-blocks. Sub-block 1241 includes the five contacts 910-1 . . . 910-5 of structure 900. Sub-blocks 1242, 1243, 1244, 1245, 1246, and 1247 also include five contacts 910. Other structures, formed similar to the process flow of FIGS. 4-11B, can have a different number of contacts within sub-blocks. The contacts of block 1240 are formed in a staggered manner with respect to directly adjacent sub-groups in the x-y plane. The staggering of contacts, as illustrated in FIG. 12A, allows the contacts to be structured having a larger area than attainable with forming the contacts in adjacent subblocks in a linear manner in the x-y plane with the contacts at the same x positions.

Figure 12B:
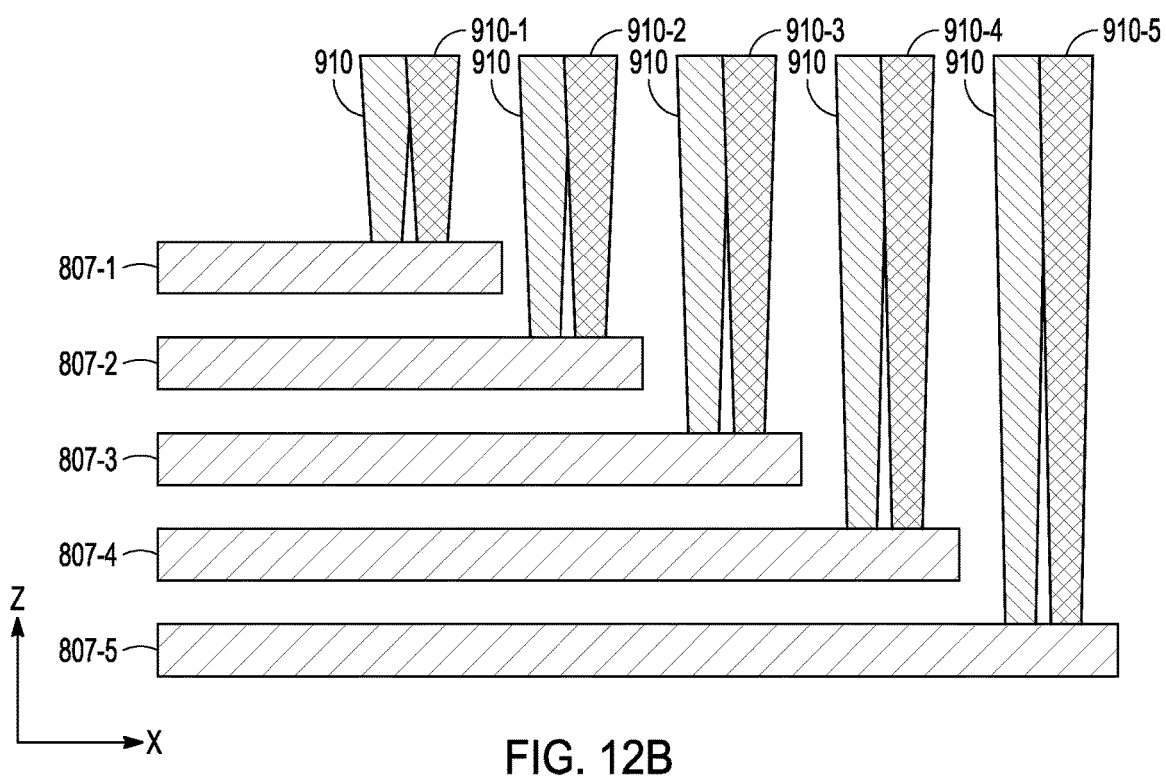
FIG. 12B is a partial side view of the example structure of FIG. 9A having the block of drain-side-select-gate contacts of FIG. 12A.

FIG. 12B is a partial side view of structure 900 of FIGS. 9A-9B having block 1240 of SGD contacts of FIG. 12A. The partial side view is in the z-x plane. The staggering of contacts of block 1240 of SGD contacts of FIG. 12A is further illustrated in FIG. 12B. The five contacts 910-1 . . . 910-5 of sub-block 1241 are coupled to SGD select lines 807-1 . . . 807-5 that are formed as steps in stadium 505 of structure 900. Contacts 910 are coupled to other select lines not shown in this cross-sectional view.

Figure 13A:
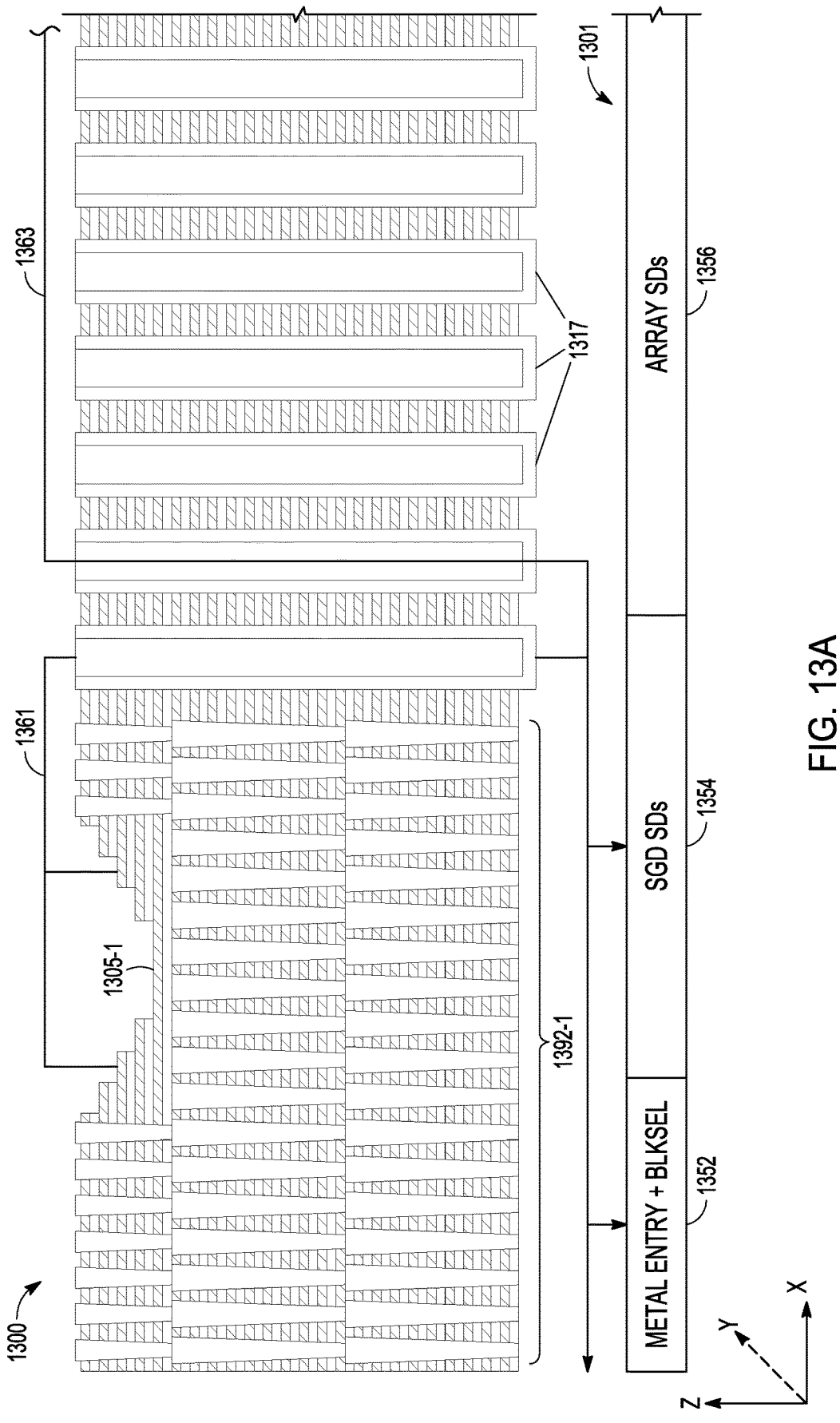
FIGS. 13A-16B represent different configurations of circuitry in a circuit-under-array region of a memory device having drain-side-select-gate stadia located within or partially within pillar progressions, in accordance with various embodiments.
Figure 13B:
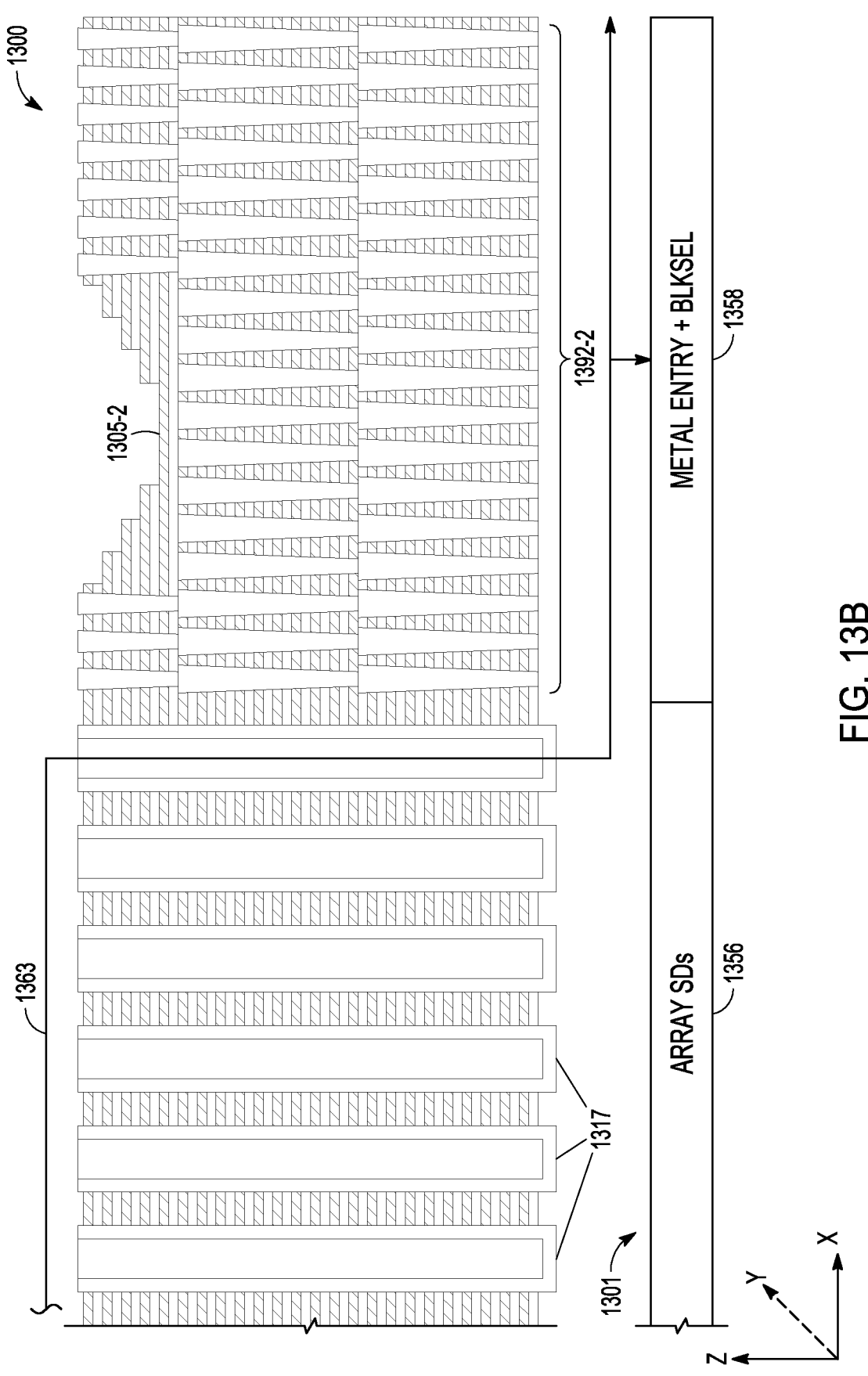

FIGS. 13A-16B represent different configurations of circuitry in a CUA region of a memory device having SGD stadia located within or partially within pillar progressions. FIGS. 13A-13B illustrate a structure 1300 having a SGD stadium 1305-1 and a SGD stadium 1305-2. SGD stadium 1305-1 is located in a pillar progression 1392-1 within a top most level of pillars dedicated to SGD stadium 1305-1. SGD stadium 1305-2 is located in a pillar progression 1392-2 within a top most level of pillars dedicated to stadium 1305-2. Structure 1300 can be formed similar to the process flow of FIGS. 4-11B. Structure 1300 can include a CUA region 1301 having a first metal entry and block select (BLKSEL) region 1352, SGD string drivers (SDs) 1354, array SDs 1356 for other components associated with the strings of the memory array, and a second metal entry and block select region 1358. BLKSEL region 1352 can include circuitry to select a block operationally addressed. SGD SDs 1354 are located under SGD stadium 1305-1. Routing of signal 1361 between a SGD select line of SGD stadium 1305-1 to SGD SDs 1354 can be performed using a thru-via 1317 next to SGD stadium 1305-1. Signal 1363 between second metal entry and block select region 1358 and first metal entry and block select region 1352 can be routed using selected ones of thru-vias 1317.

Figure 14A:
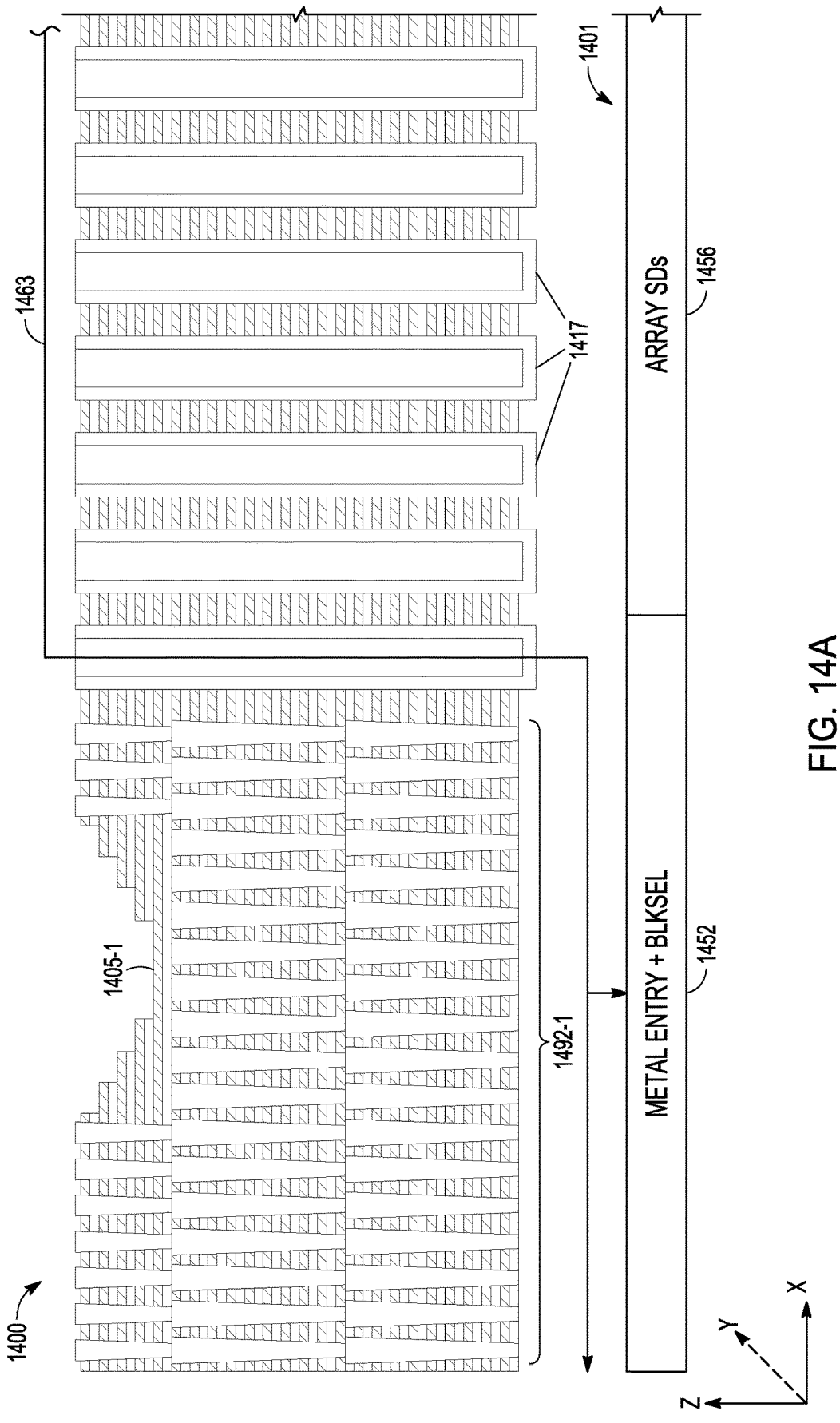
Figure 14B:
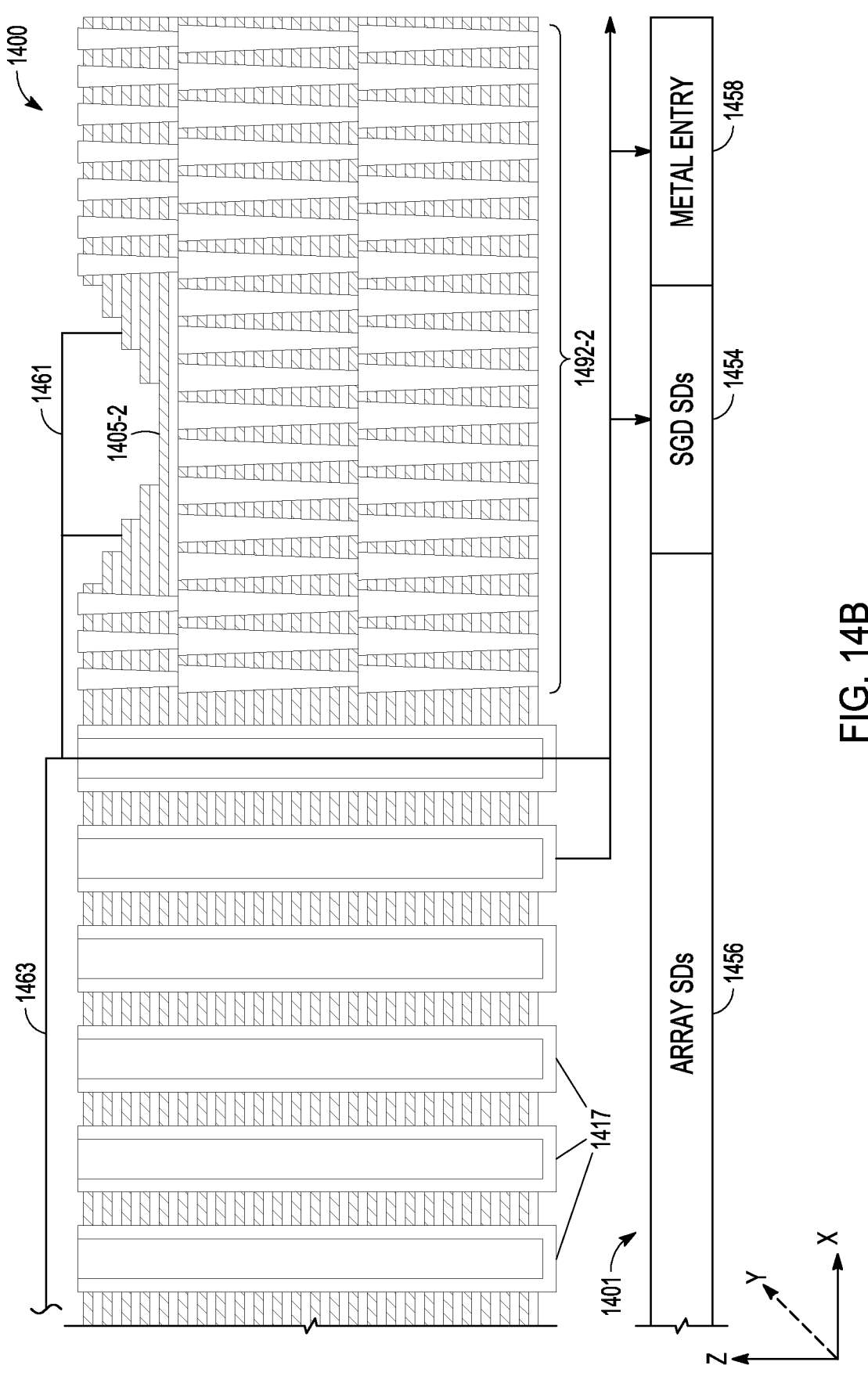

FIGS. 14A-14B illustrate a structure 1400 having a SGD stadium 1405-1 and a SGD stadium 1405-2. Stadium 1405-1 is located in a pillar progression 1492-1 within a top most level of pillars dedicated to stadium 1405-1. Stadium 1405-2 is located in a pillar progression 1492-2 within a top most level of pillars dedicated to stadium 1405-2. Structure 1400 can be formed similar to the process flow of FIGS. 4-11B. Structure 1400 can include a CUA region 1401 having a metal entry and block select region 1452, SGD SDs 1454, array SDs 1456 for other components associated with the strings of the memory array, and a metal entry region 1458. SGD SDs 1454 are located under SGD stadium 1405-2. Routing of signal 1461 between select lines of SGD stadium 1405-2 to SGD SDs 1454 can be performed using a thru-via 1417 next SGD stadium 1405-2. Signal 1463 can be routed between metal entry and block select region 1452 and metal entry 1458 region using selected ones of thru-vias 1417.

Figure 15A:
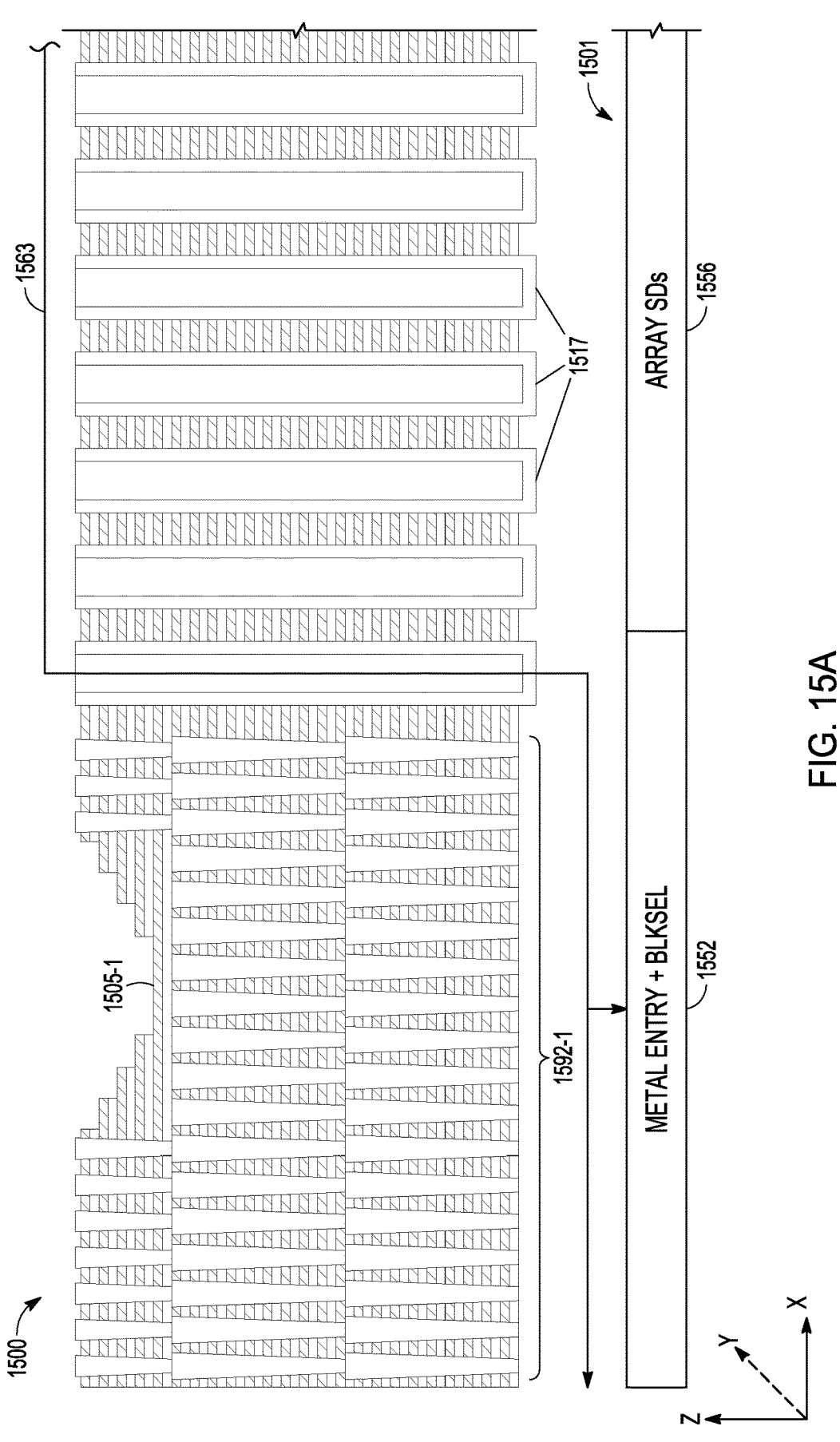
Figure 15B:
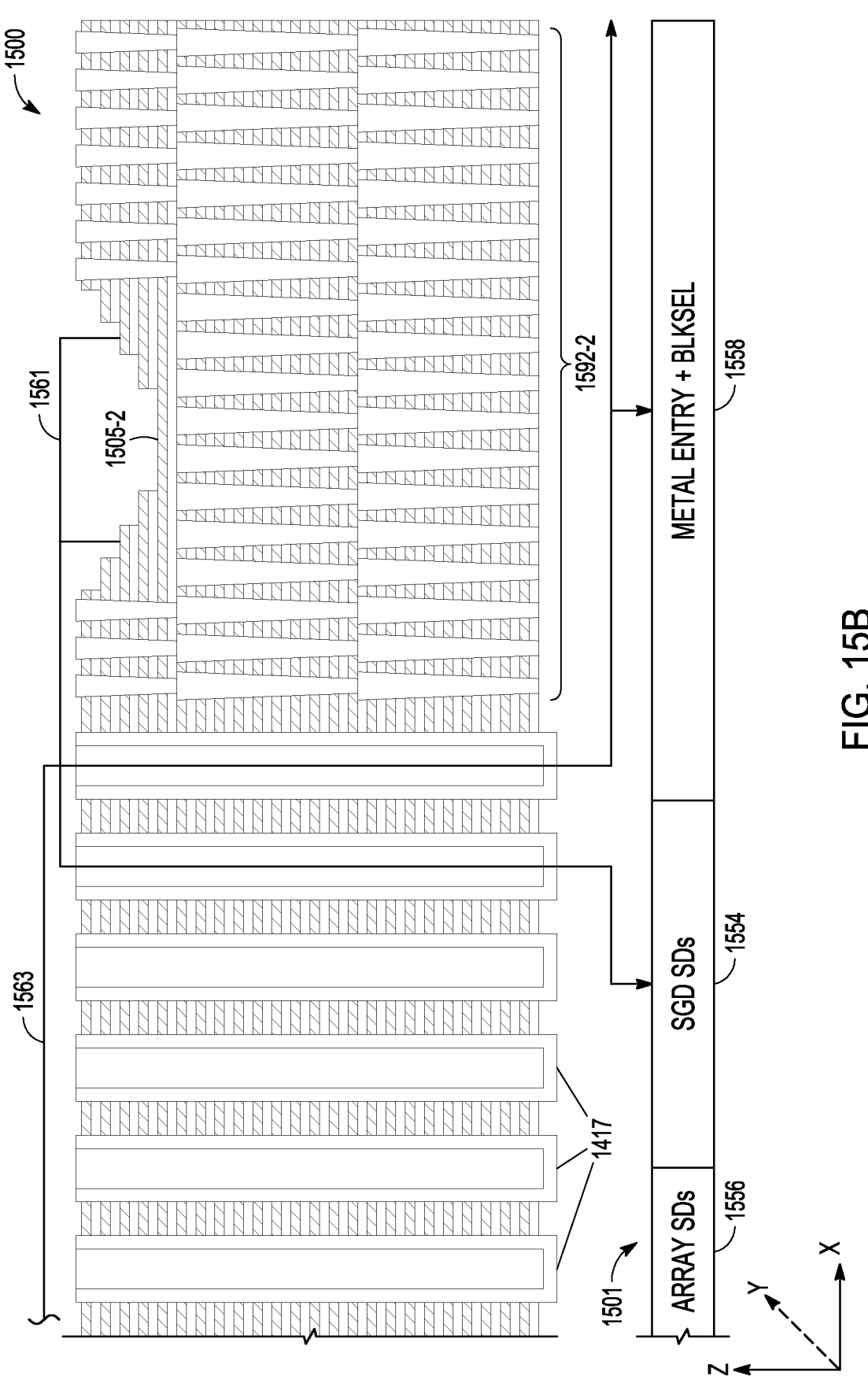

FIGS. 15A-15B illustrate a structure 1500 having a SGD stadium 1505-1 and a SGD stadium 1505-2. Stadium 1505-1 is located in a pillar progression 1592-1 within a top most level of pillars dedicated to stadium 1505-1. Stadium 1505-2 is located in a pillar progression 1592-2 within a top most level of pillars dedicated to stadium 1505-2. Structure 1500 can be formed similar to the process flow of FIGS. 4-11B. Structure 1500 can include a CUA region 1501 having a first metal entry and BLKSEL region 1552, SGD SDs 1554, array SDs 1556 for other components associated with the strings of the memory array, and a second metal entry and block select region 1558. SGD SDs 1554 are located outside both SGD stadium 1505-1 and SGD stadium 1505-2, that is, SGD SDs 1554 is outside the horizontal extent of both SGD stadium 1505-1 and SGD stadium 1505-2 and is under several of thru-vias 1517 and not under pillar progression 1592-1 or pillar progression 1592-2. Routing of signal 1561 between select lines of SGD stadium 1505-2 to SGD SDs 1554 can be performed using a thru-via 1517 near SGD stadium 1505-2, but not directly next to SGD stadium 1505-2. Signal 1563 between second metal entry and block select region 1558 and first metal entry and block select region 1552 can be routed using selected ones of thru-vias 1517.

Figure 16A:
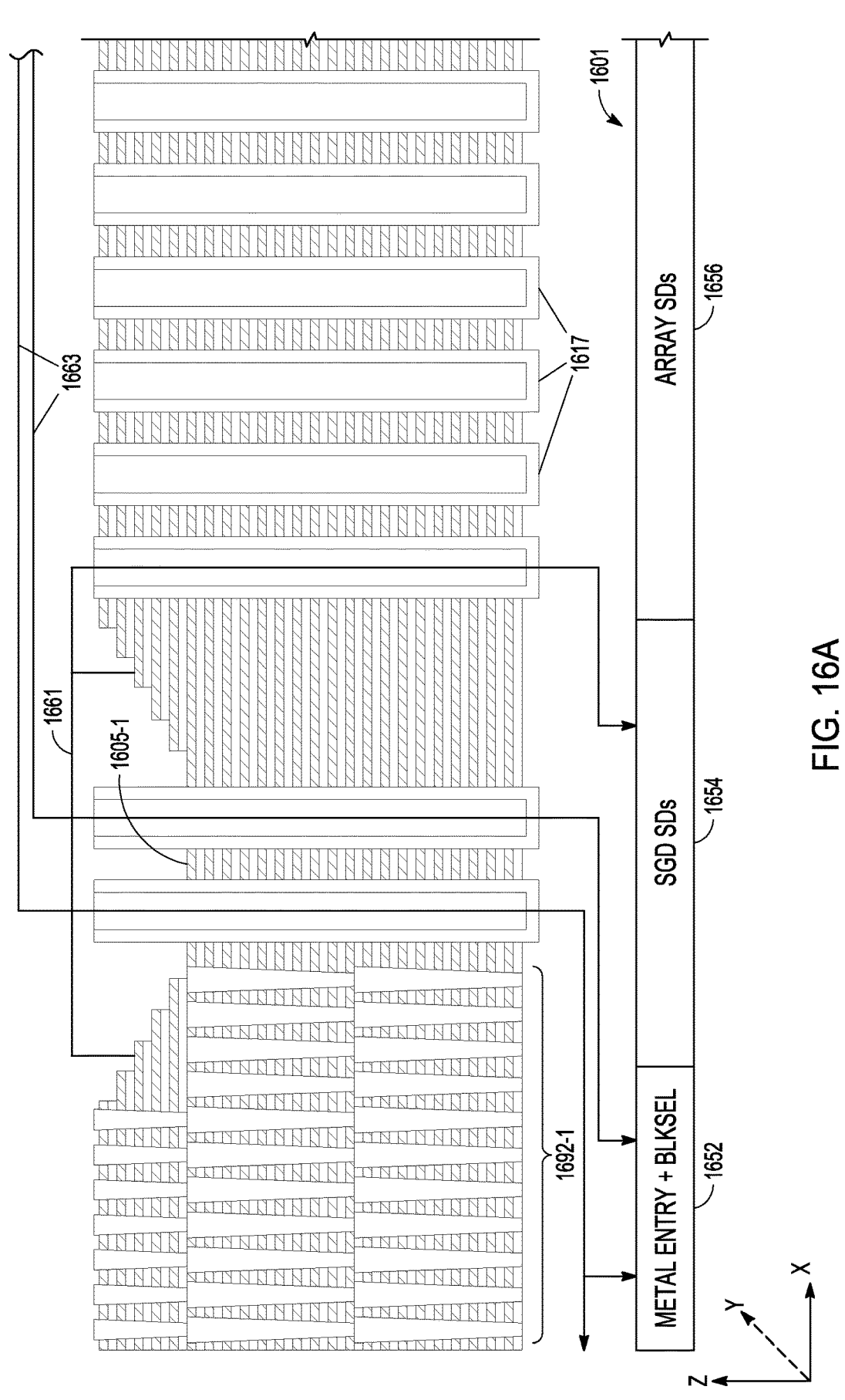
Figure 16B:
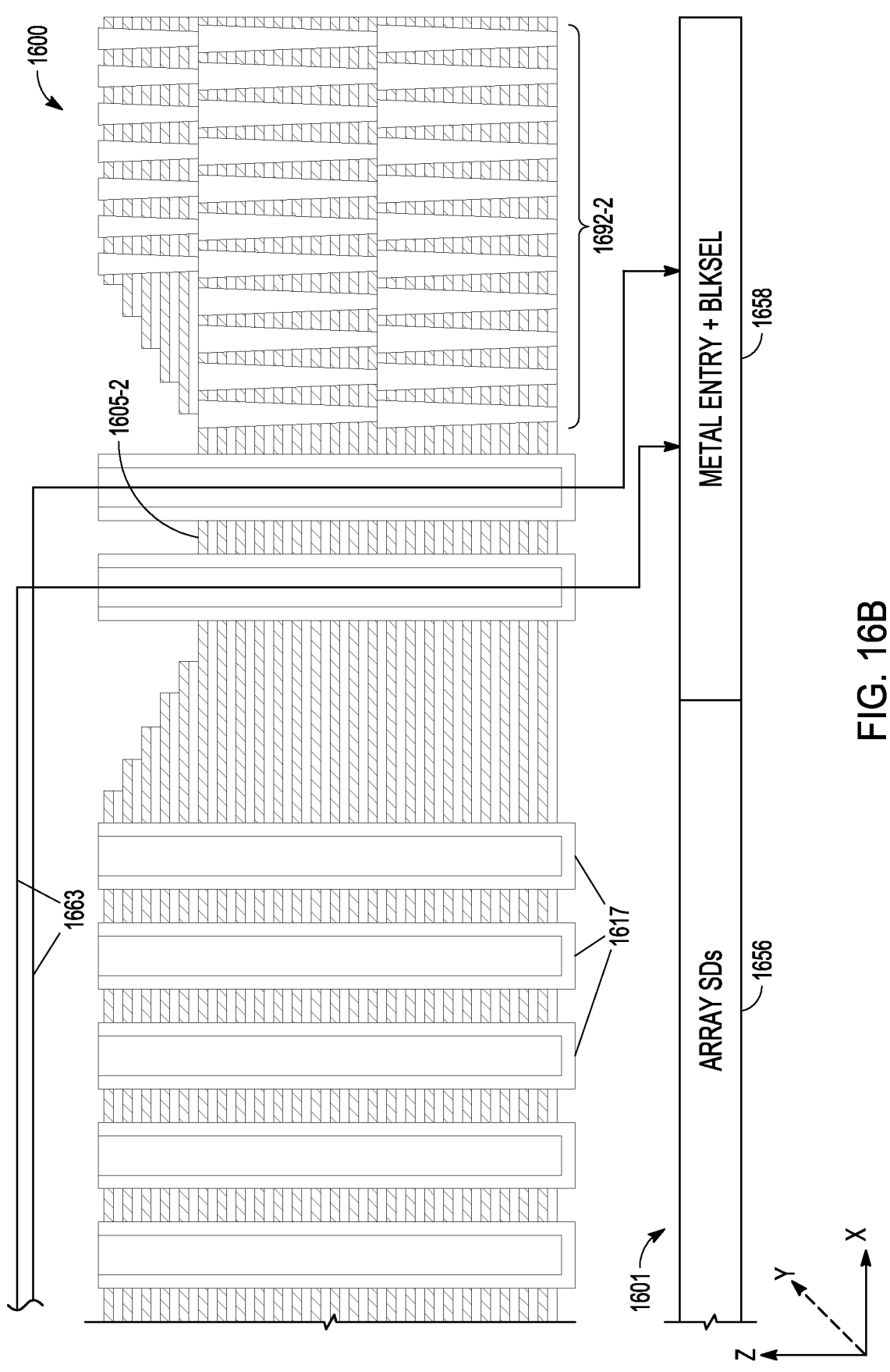

FIG. 16A-16B illustrate a structure 1600 having a SGD stadium 1605-1 and a SGD stadium 1605-2. Stadium 1605-1 is located partially in a pillar progression 1692-1, with one-half of the tiers of stadium 1605-1 within a top most level of pillars dedicated to stadium 1605-1. Stadium 1605-2 is located partially in a pillar progression 1692-2, with one-half of the tiers of stadium 1605-2 within a top most level of pillars dedicated to stadium 1605-2. Structure 1600 can be formed similar to the process flow of FIGS. 4-11. Structure 1600 can include a CUA region 1601 having a first metal entry and BLKSEL region 1652, SGD SDs 1654, array SDs 1656 for other components associated with the strings of the memory array, and a second metal entry and block select region 1658. SGD SDs 1554 is located under stadium 1605-1, with part of SGD SDs 1554 under pillar progression 1692-1 and part of SGD SDs 1654 outside pillar progression 1692-1 under a number of thru-vias 1617. Routing of signal 1661 between a select line of SGD stadium 1605-1 to SGD SDs 1654 can be performed using a thru-via 1617 outside SGD stadium 1605-1, where signal 1661 can be routed without using thru vias 1617 within SGD stadium 1605-1. Alternatively, structure 1600 can include routing signal 1661 using thru-vias 1617 positioned within the horizontal extent of SGD stadium 1605-1. Signal 1663 between second metal entry and block select region 1658 and first metal entry and block select region 1652 can be routed using selected ones of thru-vias 1617 positioned within the horizontal extent of SGD stadium 1605-1 and thru-vias 1617 positioned within the horizontal extent of SGD stadium 1605-2.

Structures 1300-1600 of FIGS. 13A-16B illustrate positioning of circuit regions in CUA regions of a memory device. The SGD SDs of a memory device can be located directly under pillar progressions with SGD stadiums entirely within the pillar progressions, outside the horizontal extent of the pillar progressions with SGD stadiums entirely within the pillar progressions, or partially under pillar progressions with SGD stadiums partially within the pillar progressions. Other structures can be formed for a memory device. Wire routing can be conducted under different permutations of routing above the level of the memory array and SGD stadiums and routing above the level of the memory array and the pillar progressions. Selection of the wiring can depend on available space for the components of the memory device.

FIG. 17 is a diagram of features of an embodiment of an example method of forming a memory device. At 1710, an array of vertical memory cells is formed, where the vertical memory cells are arranged in tiers. At 1720, one or more SGD transistors to the array are formed. At 1730, a pillar progression of levels of pillars is formed. Each pillar of one level is structured on and extending vertically from a different pillar of a level on which the one level is located. The pillar progression provides support for the tiers of vertical memory cells and the one or more SGD transistors. At 1740, a SGD stadium for coupling to the one or more SGD transistors is formed, including locating the SGD stadium within at least a portion of the pillar progression.

Variations of method 1700 or methods similar to method 1700 can include a number of different embodiments that can be combined depending on the application of such methods and/or the architecture of systems for which such methods are implemented. Such methods can include, as part of forming the pillar progression, forming a level of pillars dedicated to the SGD stadium and structured as a top level of the pillar progression and forming one or more levels of pillars arranged as supports in forming the array of vertical memory cells. Such variations can include forming the one or more levels of pillars, arranged as supports, to a height below a level for forming the SGD stadium. Variations of method 1700 or methods similar to method 1700 can include forming the SGD stadium having a horizontal extent entirely located within the pillar progression.

FIG. 18 is a flow diagram of features of an embodiment of an example method 1800 of forming a memory device. At 1810, a portion of a pillar progression of levels of pillars is formed through alternating regions of a first dielectric material and a second dielectric material, where the alternating regions are formed extending above a substrate. Each pillar of one level of the pillar progression is structured on and extending vertically from a different pillar of a level on which the one level is located. At 1820, a first stadium is formed in the alternating regions above at least a portion of the pillar progression. The first stadium can be dedicated to SGD transistors, with the SGD transistors arranged in different tiers. At 1830, multiple stadia are formed in the alternating regions adjacent to the pillar progression. The first stadium can be formed shallower than each of the multiple stadia. At 1840, an additional level of pillars to the portion of the pillar progression is formed. Each pillar of the additional level is structured on and extending vertically from a different pillar of a level on which the additional level is located. The additional level of pillars can be dedicated to the first stadium. At 1850, contact structures are formed in the first stadium to couple to SGD transistors.

Variations of method 1800 or methods similar to method 1800 can include a number of different embodiments that can be combined depending on the application of such methods and/or the architecture of systems for which such methods are implemented. Such methods can include performing, after forming the additional level of pillars on the portion of the pillar progression, a replacement gate process to form gates to memory cells and the SGD transistors. Variations can include forming metal entry to carry signals to one or more circuits below a bottom level of the pillar progression, including positioning the metal entry in a middle section of the first stadium or in a side of the first stadium structured without electrical coupling for other regions of the memory device.

In various embodiments, a memory device can comprise an array of vertical memory cells arranged in tiers and one or more SGD transistors to the array. The memory device can comprise a pillar progression of levels of pillars, with each pillar of one level structured on and extending vertically from a different pillar of a level on which the one level is located. The pillar progression provides support for the tiers of vertical memory cells and the one or more SGD transistors. A SGD stadium is provided for coupling to the one or more SGD transistors, where the SGD stadium is located within at least a portion of the pillar progression. The pillar progression can include a level of pillars dedicated to the SGD stadium and structured as a top level of the pillar progression and one or more levels of pillars arranged for the array of vertical memory cells.

Variations of such a memory device or similar memory devices can include a number of different embodiments that can be combined depending on the application of such memory devices and/or the architecture of systems in which such memory devices are implemented. Such memory devices can include levels of pillars of the pillar progression, which are structured to support the array of vertical memory cells, being located under the SGD stadium. Variations of the memory device can include the pillar progression being a lateral extension of pillars of the array.

Variations of such a memory device or similar memory devices can include horizontal extent of the SGD stadium being entirely located within the pillar progression. The memory device can include block select circuitry positioned below a bottom level of the pillar progression to one side of a portion of the memory array, and SGD drivers positioned below the bottom level of the pillar progression under the portion of the memory array. Variations of such a memory device or similar memory devices can include a middle section of the SGD stadium or in a side of the SGD stadium without electrical coupling for the one or more SGD transistors arranged to position metal entry to carry signals to one or more circuits below a bottom level of the pillar progression.

In various embodiments, a memory device can comprise an array of vertical memory cells arranged in tiers and SGD transistors to the array. The memory device can comprise a pillar progression of levels of pillars extending vertically above a substrate, where the levels of pillars are arranged horizontally into multiple sections. Each pillar of one level is structured on and extending vertically from a different pillar of a level on which the one level is located. The pillar progression provides support for tiers of vertical memory cells and the SGD transistors. The memory device comprises a SGD stadium for coupling to the SGD transistors, where the SGD stadium is located within at least a portion of the pillar progression. SGD contacts are arranged in the multiple sections of the pillar progression within the at least a portion of the pillar progression.

Variations of such a memory device or similar memory devices can include a number of different embodiments that can be combined depending on the application of such memory devices and/or the architecture of systems in which such memory devices are implemented. Such memory devices can include the pillar progression having a level of pillars dedicated to the SGD stadium and structured as a top level of the pillar progression and one or more levels of pillars arranged to support the array of vertical memory cells and located below a bottom level of the SGD stadium.

Variations of such a memory device or similar memory devices can include SGD contacts in each tread of the SGD stadium being placed in-line or staggered according to proximity rules for integration and design. Variations can include a CUA region on which the array is located, with the SGD transistors coupled to one or more circuits in the CUA region via the SGD stadium. Variations can include horizontal extent of the SGD stadium being entirely located within the pillar progression.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. In addition, electronic devices can be broken down into several main components: a processor (e.g., a central processing unit (CPU) or other main processor); memory (e.g., one or more volatile or non-volatile RAM memory devices, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 19:
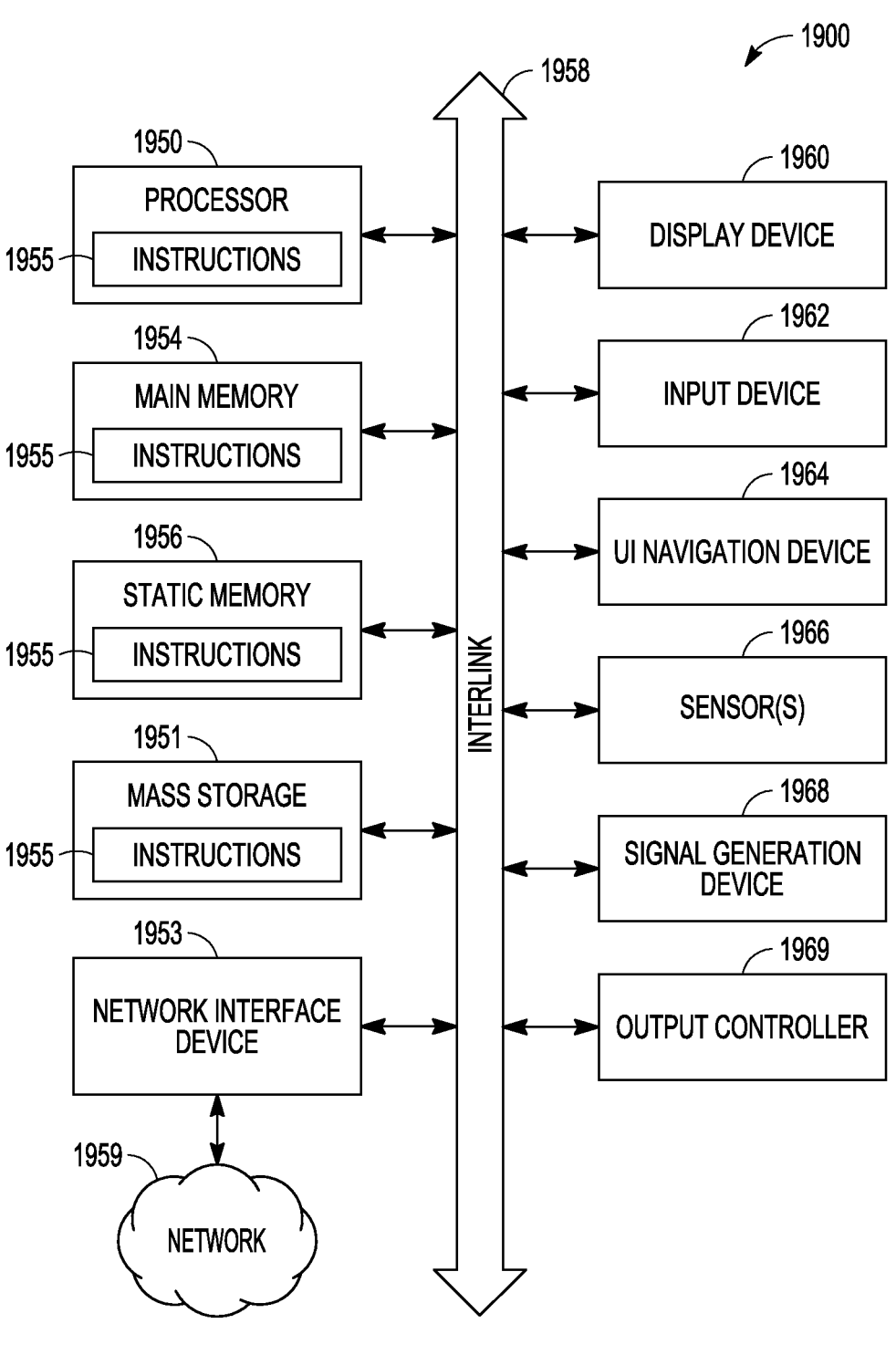
FIG. 19 is a block diagram illustrating an example of a machine in which one or more memory devices may be implemented, in accordance with various embodiments.

FIG. 19 illustrates a block diagram of an example machine 1900 upon which any one or more of the techniques (e.g., methodologies) or structures discussed herein may be implemented having one or more memory devices structured with SGD stadia located at least partially within pillar progressions for the memory devices as discussed with respect to FIGS. 1-18. In alternative embodiments, machine 1900 may operate as a standalone device or may be connected (e.g., networked) to other machines. In a networked deployment, machine 1900 may operate in the capacity of a server machine, a client machine, or both in server-client network environments. In an example, machine 1900 may act as a peer machine in peer-to-peer (P2P) (or other distributed) network environment. Machine 1900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform one or more methodologies, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation.

Machine 1900 may include a hardware processor 1950 (e.g., a CPU, a GPU, a hardware processor core, or any combination thereof), a main memory 1954, and a static memory 1956, some or all of which can communicate with each other via an interlink 1958 (e.g., bus). Machine 1900 can include a display device 1960, an input device 1962, which can be an alphanumeric input device (e.g., a keyboard), and a user interface (UI) navigation device 1964 (e.g., a mouse). In an example, display device 1960, input device 1962, and UI navigation device 1964 can be a touch screen display. Machine 1900 can additionally include a mass storage device (e.g., drive unit) 1951, a signal generation device 1968, a network interface device 1953, and one or more sensors 1966, such as a global positioning system (GPS) sensor, compass, accelerometer, or other sensor. Machine 1900 may include an output controller 1969, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 1900 can store one or more sets of data structures or instructions 1955 (e.g., software) embodying or utilized by machine 1900 to perform any one or more of the techniques or functions for which machine 1900 is designed. Instructions 1955 may also reside, completely or at least partially, within main memory 1954, within static memory 1956, or within hardware processor 1950 during execution thereof by machine 1900.

Instructions 1955 (e.g., software, programs, an operating system (OS), etc.) or other data can be stored on mass storage device 1951 or can be accessed by main memory 1954 for use by hardware processor 1950. Main memory 1954 (e.g., DRAM) is typically fast, but volatile, and thus a different type of storage than mass storage device 1951 (e.g., an SSD), which is suitable for long-term storage, including while in an "off" condition. Instructions 1955 or data in use by a user or machine 1900 are typically loaded in main memory 1954 for use by hardware processor 1950. When main memory 1954 is full, virtual space from mass storage device 1951 can be allocated to supplement main memory 1954; however, because mass storage device 1951 is typically slower than main memory 1954, and write speeds are typically at least twice as slow as read speeds, use of virtual memory can greatly reduce user experience due to storage device latency (in contrast to main memory 1954, e.g., DRAM). Further, use of mass storage device 1951 for virtual memory can greatly reduce the usable lifespan of mass storage device 1951.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 1955 can be transmitted or received over a network 1959 using a transmission medium via signal generation device 1968 or network interface device 1953 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, signal generation device 1968 or network interface device 1953 may include one or more physical jacks (e.g., Ethernet, coaxial, or phone jacks) or one or more antennas to connect to network 1959. In an example, signal generation device 1968 or network interface device 1953 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions or data to and for execution by machine 1900, and includes instrumentalities to propagate digital or analog communications signals to facilitate communication of such data or instructions, which instructions may be implemented by software.

The following are example embodiments of devices and methods, in accordance with the teachings herein.

An example memory device 1 can comprise: an array of vertical memory cells arranged in tiers; one or more SGD transistors to the array; a pillar progression of levels of pillars, with each pillar of one level structured on and extending vertically from a different pillar of a level on which the one level is located, the pillar progression providing support for the tiers of vertical memory cells and the one or more SGD transistors; and a SGD stadium for coupling to the one or more SGD transistors, the SGD stadium located within at least a portion of the pillar progression.

An example memory device 2 can include features of example memory device 1 and can include the pillar progression including a level of pillars dedicated to the SGD stadium and structured as a top level of the pillar progression and one or more levels of pillars arranged for the array of vertical memory cells.

An example memory device 3 can include features of any of the preceding example memory devices and can include levels of pillars of the pillar progression, structured to support the array of vertical memory cells, being located under the SGD stadium.

An example memory device 4 can include features of any of the preceding example memory devices and can include the pillar progression being an extension of pillars of the array.

An example memory device 5 can include features of any of the preceding example memory devices and can include horizontal extent of the SGD stadium being entirely located within the pillar progression.

An example memory device 6 can include features of example memory device 5 and any of the preceding example memory devices and can include block select circuitry positioned below a bottom level of the pillar progression to one side of a portion of the memory array; and SGD drivers are positioned below the bottom level of the pillar progression under the portion of the memory array.

An example memory device 7 can include features of any of the preceding example memory devices and can include a middle section of the SGD stadium or a side of the SGD stadium without electrical coupling for the one or more SGD transistors being arranged to position metal entry to carry signals to one or more circuits below a bottom level of the pillar progression.

In an example memory device 8, any of the memory devices of example memory devices 1 to 7 may include memory devices incorporated into an electronic memory apparatus further comprising a host processor and a communication bus extending between the host processor and the memory device.

In an example memory device 9, any of the memory devices of example memory devices 1 to 8 may be modified to include any structure presented in another of example memory device 1 to 8.

In an example memory device 10, any apparatus associated with the memory devices of example memory devices 1 to 9 may further include a machine-readable storage device configured to store instructions as a physical state, wherein the instructions may be used to perform one or more operations of the apparatus.

In an example memory device 11, any of the memory devices of example memory devices 1 to 10 may be operated in accordance with any of the methods of forming a memory devices of the below example methods 1 to 17 of forming a memory devices.

An example memory device 12 can comprise: an array of vertical memory cells arranged in tiers; drain-end select gate (SGD) transistors to the array; a pillar progression of levels of pillars extending vertically above a substrate, the levels of pillars arranged horizontally into multiple sections, with each pillar of one level structured on and extending vertically from a different pillar of a level on which the one level is located, the pillar progression providing support for tiers of vertical memory cells and the SGD transistors; a SGD stadium for coupling to the SGD transistors, the SGD stadium located within at least a portion of the pillar progression; and SGD contacts arranged in the multiple sections of the pillar progression within the at least a portion of the pillar progression.

An example memory device 13 can include features of example memory device 12 and can include SGD contacts in each tread of the SGD stadium being placed in-line or staggered according to proximity rules for integration and design.

An example memory device 14 can include features of any of the preceding example memory devices 12 and 13 and can include a circuit-under-array region on which the array is located, with the SGD transistors coupled to one or more circuits in the circuit-under-array region via the SGD stadium.

An example memory device 15 can include features of any of the preceding example memory devices 12 to 14 and can include the pillar progression including a level of pillars dedicated to the SGD stadium and structured as a top level of the pillar progression and one or more levels of pillars arranged to support the array of vertical memory cells and located below a bottom level of the SGD stadium.

An example memory device 16 can include features of any of the preceding example memory devices 12 to 15 and can include horizontal extent of the SGD stadium being entirely located within the pillar progression.

In an example memory device 17, any of the memory devices of example memory devices 12 to 16 may include memory devices incorporated into an electronic memory apparatus further comprising a host processor and a communication bus extending between the host processor and the memory device.

In an example memory device 18, any of the memory devices of example memory devices 12 to 17 may be modified to include any structure presented in another of example memory device 12 to 17.

In an example memory device 19, any apparatus associated with the memory devices of example memory devices 12 to 18 may further include a machine-readable storage device configured to store instructions as a physical state, wherein the instructions may be used to perform one or more operations of the apparatus.

In an example memory device 20, any of the memory devices of example memory devices 12 to 19 may be operated in accordance with any of the methods of forming a memory devices of the below example methods 1 to 17 of forming a memory devices.

An example method 1 of forming a memory device can comprise: forming an array of vertical memory cells arranged in tiers; forming one or more drain-end select gate (SGD) transistors to the array; forming a pillar progression of levels of pillars, with each pillar of one level structured on and extending vertically from a different pillar of a level on which the one level is located, the pillar progression providing support for the tiers of vertical memory cells and the one or more SGD transistors; and forming a SGD stadium for coupling to the one or more SGD transistors, including locating the SGD stadium within at least a portion of the pillar progression.

An example method 2 of forming a memory device can include features of example method 1 of forming a memory device and can include forming the pillar progression to include forming a level of pillars dedicated to the SGD stadium and structured as a top level of the pillar progression and forming one or more levels of pillars arranged as supports in forming the array of vertical memory cells.

An example method 3 of forming a memory device can include features of example methods 2 to 3 of forming a memory device and can include forming the one or more levels of pillars, arranged as supports, to a height below a level for forming the SGD stadium.

An example method 4 of forming a memory device can include features of example method 2 and any of the preceding example methods 1 to 3 of forming a memory devices and can include forming the SGD stadium having a horizontal extent entirely located within the pillar progression.

In an example method 5 of forming a memory device, any of the example methods 1 to 4 of forming a memory device may be performed in forming an electronic memory apparatus further comprising a host processor and a communication bus extending between the host processor and the memory device.

In an example method 6 of forming a memory device, any of the example methods 1 to 5 of forming a memory device may be modified to include operations set forth in any other of example methods 1 to 5 of forming a memory device.

In an example method of forming a memory device 7, any of the example methods 1 to 6 of forming a memory device may be implemented at least in part through use of instructions stored as a physical state in one or more machine-readable storage devices.

An example method 8 of forming a memory device can include features of any of the preceding example methods 1 to 7 of forming a memory device and can include performing functions associated with any features of example memory devices 1 to 20.

An example method 9 of forming a memory device can comprise: forming a portion of a pillar progression of levels of pillars through alternating regions of a first dielectric material and a second dielectric material, the alternating regions formed extending above a substrate, with each pillar of one level structured on and extending vertically from a different pillar of a level on which the one level is located; forming a first stadium in the alternating regions above at least a portion of the pillar progression; forming multiple stadia in the alternating regions adjacent to the pillar progression; forming an additional level of pillars to the portion of the pillar progression, with each pillar of the additional level structured on and extending vertically from a different pillar of a level on which the additional level is located; and forming contact structures in the first stadium to couple to drain-end select gate (SGD) transistors.

An example method 10 of forming a memory device can include features of example method 9 of forming a memory device and can include performing, after forming the additional level of pillars on the portion of the pillar progression, a replacement gate process to form gates to memory cells and the SGD transistors.

An example method 11 of forming a memory device can include features of any of the preceding example methods 9 and 10 of forming a memory devices and can include forming the first stadium shallower than each of the multiple stadia and dedicating the first stadium to the SGD transistors with the SGD transistors arranged in different tiers.

An example method 12 of forming a memory device can include features of any of the preceding example methods 9 to 11 of forming a memory device and can include forming metal entry to carry signals to one or more circuits below a bottom level of the pillar progression, including positioning the metal entry in a middle section of the first stadium or in a side of the first stadium structured without electrical coupling for other regions of the memory device.

In an example method 13 of forming a memory device, any of the example methods 9 to 12 of forming a memory device may be performed in forming an electronic memory apparatus further comprising a host processor and a communication bus extending between the host processor and the memory device.

In an example method 14 of forming a memory device, any of the example methods 1 to 8 of forming a memory device may be modified to include operations set forth in any other of methods 1 to 8 of forming a memory device example.

In an example method 15 of forming a memory device, any of the example methods 9 to 14 of forming a memory device may be modified to include operations set forth in any other of methods 9 to 14 of forming a memory device example.

In an example method 16 of forming a memory device, any of the example methods 9 to 15 of forming a memory device may be implemented at least in part through use of instructions stored as a physical state in one or more machine-readable storage devices.

An example method 17 of forming a memory device can include features of any of the preceding example methods 9 to 16 of forming a memory device and can include performing functions associated with any features of example memory devices 1 to 20.

An example machine-readable storage device 1 storing instructions, that when executed by one or more processors, cause a machine to perform operations, can comprise instructions to perform functions associated with any features of example memory devices 1 to 20 or perform methods associated with any features of example methods 1 to 17.

Although specific embodiments have been illustrated and described herein, any arrangement that is calculated to achieve the same purpose may be substituted for the specific embodiments shown. Various embodiments can use permutations and/or combinations of embodiments described herein. The above description is intended to be illustrative, and not restrictive, and that the phraseology or terminology employed herein is for the purpose of description.

What is claimed is:

1. A memory device comprising:
an array of vertical memory cells arranged in tiers;
drain-end select gate (SGD) transistors coupled to the array;
a pillar progression of levels of pillars, with each pillar of one level structured on and extending vertically from a different pillar of a level on which the one level is located except for each pillar of a bottom level of the pillar progression, the pillar progression providing support for the tiers of vertical memory cells and the SGD transistors; and
a SGD stadium having conductive steps coupled to the SGD transistors such that the SGD stadium is dedicated to the conductive steps to the SGD transistors, the SGD stadium located within at least a portion of the pillar progression.

2. The memory device of claim 1, wherein the pillar progression includes a level of pillars dedicated to the SGD stadium and structured as a top level of the pillar progression and one or more levels of pillars arranged for the array of vertical memory cells.

3. The memory device of claim 1, wherein levels of pillars of the pillar progression, structured to support the array of vertical memory cells, are located under the SGD stadium.

4. The memory device of claim 1, wherein the pillar progression is an extension of pillars of the array.

5. The memory device of claim 1, wherein horizontal extent of the SGD stadium is entirely located within the pillar progression.

6. The memory device of claim 5, wherein the memory device includes:
block select circuitry positioned below a bottom level of the pillar progression to one side of a portion of the memory array; and
SGD drivers are positioned below the bottom level of the pillar progression under the portion of the memory array.

7. The memory device of claim 1, wherein a middle section of the SGD stadium or a side of the SGD stadium without electrical coupling for the SGD transistors is arranged to position metal entry to carry signals to one or more circuits below a bottom level of the pillar progression.

8. A memory device comprising:
an array of vertical memory cells arranged in tiers;
drain-end select gate (SGD) transistors coupled to the array;
a pillar progression of levels of pillars extending vertically above a substrate, the levels of pillars arranged horizontally into multiple sections, with each pillar of one level structured on and extending vertically from a different pillar of a level on which the one level is located except for each pillar of a bottom level of the pillar progression, the pillar progression providing support for tiers of vertical memory cells and the SGD transistors;
a SGD stadium having conductive steps coupled to the SGD transistors such that the SGD stadium is dedicated to the conductive steps to the SGD transistors, the SGD stadium located within at least a portion of the pillar progression; and
SGD contacts arranged in the multiple sections of the pillar progression within the at least a portion of the pillar progression.

9. The memory device of claim 8, wherein SGD contacts in each tread of the SGD stadium are placed in-line or staggered according to proximity rules for integration and design.

10. The memory device of claim 8, wherein the memory device includes a circuit-under-array region on which the array is located, with the SGD transistors coupled to one or more circuits in the circuit-under-array region via the SGD stadium.

11. The memory device of claim 8, wherein the pillar progression includes a level of pillars dedicated to the SGD stadium and structured as a top level of the pillar progression and one or more levels of pillars arranged to support the array of vertical memory cells and located below a bottom level of the SGD stadium.

12. The memory device of claim 8, wherein horizontal extent of the SGD stadium is entirely located within the pillar progression.

13. A method of forming a memory device, the method comprising:
forming an array of vertical memory cells arranged in tiers;
forming drain-end select gate (SGD) transistors coupled to the array;
forming a pillar progression of levels of pillars, with each pillar of one level structured on and extending vertically from a different pillar of a level on which the one level is located except for each pillar of a bottom level of the pillar progression, the pillar progression providing support for the tiers of vertical memory cells and the SGD transistors; and
forming a SGD stadium having a conductive step coupled to the SGD transistors such that the SGD stadium is dedicated to the conductive steps to the SGD transistors, including locating the SGD stadium within at least a portion of the pillar progression.

14. The method of claim 13, wherein forming the pillar progression includes forming a level of pillars dedicated to the SGD stadium and structured as a top level of the pillar progression and forming one or more levels of pillars arranged as supports in forming the array of vertical memory cells.

15. The method of claim 14, wherein the method includes forming the one or more levels of pillars, arranged as supports, to a height below a level for forming the SGD stadium.

16. The method of claim 13, wherein the method includes forming the SGD stadium having a horizontal extent entirely located within the pillar progression.

17. A method of forming a memory device, the method comprising:

forming a portion of a pillar progression of levels of pillars through alternating regions of a first dielectric material and a second dielectric material, the alternating regions formed extending above a substrate, with each pillar of one level structured on and extending vertically from a different pillar of a level on which the one level is located except for each pillar of a bottom level of the pillar progression;

forming a first stadium, dedicated to drain-end select gate (SGD) transistors to couple to an array of vertical memory cells, in the alternating regions above at least a portion of the pillar progression;

forming multiple stadia in the alternating regions adjacent to the pillar progression;

forming an additional level of pillars to the portion of the pillar progression, with each pillar of the additional level structured on and extending vertically from a different pillar of a level on which the additional level is located; and forming contact structures in the first stadium to couple to the SGD transistors.

18. The method of claim 17, wherein the method includes performing, after forming the additional level of pillars on the portion of the pillar progression, a replacement gate process to form gates to memory cells and the SGD transistors.

19. The method of claim 17, wherein the method includes forming the first stadium shallower than each of the multiple stadia and dedicating the first stadium to the SGD transistors with the SGD transistors arranged in different tiers.

20. The method of claim 17, wherein the method includes forming metal entry to carry signals to one or more circuits below a bottom level of the pillar progression, including positioning the metal entry in a middle section of the first stadium or in a side of the first stadium structured without electrical coupling for other regions of the memory device.

* * * * *